US010063800B2

(12) United States Patent
Jung et al.

(10) Patent No.: US 10,063,800 B2
(45) Date of Patent: Aug. 28, 2018

(54) IMAGE SENSOR USING NANOWIRE AND METHOD OF MANUFACTURING THE SAME

(71) Applicant: KOREA ELECTRONICS TECHNOLOGY INSTITUTE, Seongnam-si, Gyeonggi-do (KR)

(72) Inventors: Suk Won Jung, Osan-si (KR); Yeon Shik Choi, Seoul (KR); Young Chang Jo, Yongin-si (KR); Jae Gi Son, Yongin-si (KR); Ki Man Jeon, Seongnam-si (KR); Woo Kyeong Seong, Seongnam-si (KR); Kook Nyung Lee, Seoul (KR); Min Ho Lee, Seoul (KR); Hyuck Ki Hong, Uijeongbu-si (KR)

(73) Assignee: Korea Electronics Technology Institute, Gyeonggi-do (KR)

( * ) Notice: Subject to any disclaimer, the term of this patent is extended or adjusted under 35 U.S.C. 154(b) by 25 days.

(21) Appl. No.: 15/212,076

(22) Filed: Jul. 15, 2016

(65) Prior Publication Data

US 2017/0187974 A1    Jun. 29, 2017

(30) Foreign Application Priority Data

Dec. 29, 2015 (KR) .......................... 10-2015-0188468

(51) Int. Cl.
*H04N 5/374* (2011.01)
*H01L 31/0352* (2006.01)
(Continued)

(52) U.S. Cl.
CPC ......... *H04N 5/374* (2013.01); *H01L 27/1461* (2013.01); *H01L 27/14607* (2013.01);
(Continued)

(58) Field of Classification Search
CPC .......................... H04N 5/374–5/37457; H01L 27/146–27/14676; H01L 31/035227
See application file for complete search history.

(56) References Cited

U.S. PATENT DOCUMENTS 8,604,528 B2   12/2013  Yoshida
9,117,724 B2    8/2015  Furukawa et al.
(Continued)

FOREIGN PATENT DOCUMENTS

JP   2007-184566 A   7/2007
KR  10-2011-0015603 A  2/2011
(Continued)

OTHER PUBLICATIONS

Kook-Nyung Lee et al., "Fabrication of Suspended Silicon Nanowire Arrays," Semiconductor nanowires, small 2008, 4, No. 5, pp. 642-648, Apr. 22, 2008.
Summary of Office Action, issued by the Korean Intellectual Property Office dated Apr. 14, 2017.

*Primary Examiner* — Paul Berardesca
(74) *Attorney, Agent, or Firm* — Knobbe, Martens, Olson & Bear, LLP

(57) ABSTRACT

Disclosed is an image sensor using a nanowire, including a substrate, a photodetector for sensing incident light to produce photocurrent, the magnitude of which varies depending on the intensity of incident light, a signal processing module for outputting photodetection current including information about the presence or absence of incident light and the intensity of incident light based on the presence or absence of photocurrent and the magnitude thereof, and an electrode configured to electrically connect the photodetector and the signal processing module to each other and formed on the photodetector and the signal processing module, wherein the
(Continued)

photodetector and the signal processing module are formed on the substrate, and the photodetector is formed of at least one silicon nanowire.

10 Claims, 26 Drawing Sheets

(51) Int. Cl.
    *H01L 31/0224*     (2006.01)
    *H01L 29/49*     (2006.01)
    *H01L 27/146*     (2006.01)

(52) U.S. Cl.
    CPC .... *H01L 27/14689* (2013.01); *H01L 29/4916* (2013.01); *H01L 31/022408* (2013.01); *H01L 31/035227* (2013.01)

(56) References Cited

U.S. PATENT DOCUMENTS

| | | | | |
|---|---|---|---|---|
| 2012/0145880 A1* | 6/2012 | Wober | ............... | B82Y 30/00 |
| | | | | 250/208.1 |
| 2012/0228682 A1* | 9/2012 | Yoshida | ............ | H01L 27/14612 |
| | | | | 257/291 |
| 2013/0215308 A1* | 8/2013 | Furukawa | .............. | H04N 5/374 |
| | | | | 348/308 |

FOREIGN PATENT DOCUMENTS

| | | |
|---|---|---|
| KR | 10-2012-0104093 A | 9/2012 |
| KR | 10-2013-0096176 A | 8/2013 |
| WO | WO 2009/136906 A1 | 11/2009 |

\* cited by examiner

IMAGE SENSOR USING NANOWIRE AND METHOD OF MANUFACTURING THE SAME

CROSS-REFERENCE TO RELATED APPLICATIONS

This application claims the benefit of Korean Patent Application No. 10-2015-0188468, filed Dec. 29, 2015, entitled "Image Sensor using a Nanowire and Method of Manufacturing the Same", which is hereby incorporated by reference in its entirety into this application.

BACKGROUND OF THE INVENTION

Field of the Invention

The present invention relates to an image sensor using a nanowire and a method of manufacturing the same.

Description of the Related Art

An image sensor is a semiconductor device for converting an optical image into an electrical signal, and may include, for example, a CCD (Charge Coupled Device) image sensor and a CMOS (Complementary Metal-Oxide-Semiconductor) image sensor. A CCD image sensor is a device configured such that MOS (Metal-Oxide-Silicon) capacitors are positioned very close to each other and charge carriers are stored in the capacitors and transported, and a CMOS image sensor is a device, which employs a switching mode, configured such that MOS transistors, provided in the same number as the number of pixels, are constituted through CMOS technology, using a control circuit and a signal processing circuit, which serves as a peripheral circuit, and are used to sequentially detect outputs.

The CMOS image sensor is advantageous compared to the CCD image sensor, which is widely used as an existing image sensor, because the operating mode is simple, a variety of scanning methods are possible, and a signal processing circuit may be integrated into a single chip, thus enabling the reduction in size of products, decreasing manufacturing costs thanks to the compatible use of CMOS technology, and lowering power consumption.

With advancements in image sensor technology, the size of photodiodes is gradually decreased in order to realize an increase in the number of pixels without increasing the size of chips, and thus the area of light-receiving units is reduced, resulting in deteriorated image quality. A typical image sensor has a front illumination structure, in which photodiodes are formed under the surface of the substrate, logic circuits are formed on the substrate, and light is radiated onto the upper surface of the substrate. However, light loss is caused by the upper layers formed on the photodiodes, undesirably deteriorating the light response characteristics of the photodiodes. Also, the penetration depth of photons is increased, making it difficult to convert the injected light flux into photocharges.

CITATION LIST

Patent Literature (Patent Document 1) KR2011-0015603 A

SUMMARY OF THE INVENTION

Accordingly, the present invention is intended to provide an image sensor including a photodetector formed of a nanowire and a signal processing module formed on the same substrate as the photodetector.

In addition, the present invention is intended to provide a method of manufacturing an image sensor including a photodetector formed of a nanowire and a signal processing module formed on the same substrate as the photodetector.

In addition, the present invention is intended to provide an image sensor including a photodetector formed of a nanowire, and a signal processing module, which is formed on the same substrate as the photodetector and includes a plurality of MOSFETs (Metal-Oxide-Semiconductor Field-Effect Transistors) formed of nanowires.

In addition, the present invention is intended to provide a method of manufacturing an image sensor including a photodetector formed of a nanowire, and a signal processing module, which is formed on the same substrate as the photodetector and includes a plurality of MOSFETs formed of nanowires.

A first embodiment of the present invention provides an image sensor using a nanowire, comprising: a substrate, a photodetector for sensing incident light to produce photocurrent, a magnitude of which varies depending on an intensity of incident light, a signal processing module for outputting photodetection current including information about the incident light based on presence or absence of the photocurrent and a magnitude thereof, and an electrode configured to electrically connect the photodetector and the signal processing module to each other and formed on the photodetector and the signal processing module, wherein the photodetector and the signal processing module are formed on the substrate, and the photodetector is formed of at least one silicon nanowire.

Also, the photodetector may be configured such that one region and a remaining region of the nanowire are doped with a p-type dopant and an n-type dopant, respectively, so as to form a p-n junction between an n-type region and a p-type region in the nanowire.

Also, the photodetector may be configured such that the nanowire is doped with a p-type dopant or an n-type dopant and thus a resistance value of the nanowire varies depending on the intensity of incident light.

Also, the nanowire may have an inverted triangular-shaped cross-section with an inner angle $\theta$ that falls within a predetermined range, and the surface of the nanowire may be covered with a silicon dioxide film.

In addition, a second embodiment of the present invention provides an image sensor using a nanowire, comprising: a substrate, a photodetector formed of at least one silicon nanowire on the substrate and configured to sense incident light to produce photocurrent, a magnitude of which varies depending on an intensity of incident light, a signal processing module configured to include a plurality of MOSFETs formed of a silicon nanowire on the substrate and to output photodetection current including information about the incident light based on a voltage of a capacitor varying depending on a magnitude of the photocurrent, and an electrode configured to electrically connect the photodetector and the signal processing module to each other and formed on the photodetector and the signal processing module.

Also, each of the MOSFETs may include: a source formed by implanting a dopant into one end of the nanowire, a drain formed by implanting the dopant into a remaining end of the nanowire, and a poly-silicon gate formed between the source and the drain.

Also, the signal processing module may include: a first MOSFET circuit comprising a second nanowire formed continuously in a longitudinal direction from one end of a first nanowire on which the photodetector is formed, and a second MOSFET circuit comprising a third nanowire, which is spaced apart from the first nanowire at a predetermined interval in a width direction.

Also, the first MOSFET circuit may include: a first MOSFET, which is spaced apart from the photodetector at a predetermined interval in a longitudinal direction of the first nanowire and which causes voltage of a capacitor connected to one end thereof to vary, and a second MOSFET, which is spaced apart from the first MOSFET at a predetermined interval in the longitudinal direction of the first nanowire and which causes the voltage of the capacitor to initialize to a reference voltage, and the second MOSFET circuit may include: a third MOSFET comprising the third nanowire and producing current that varies depending on a magnitude of the voltage of the capacitor, and a fourth MOSFET spaced apart from the third MOSFET at a predetermined interval in a longitudinal direction of the third nanowire and configured to transfer current produced from the third MOSFET to the outside.

Also, the first to third nanowires may have an inverted triangular-shaped cross-section with an inner angle θ that falls within a predetermined range, and the surface thereof is covered with a silicon dioxide film.

In addition, the present invention provides a method of manufacturing the image sensor using a nanowire according to the second embodiment, comprising: (1) preparing a substrate including a photodetection region and a signal processing region, (2) forming at least one nanowire having an inverted triangular-shaped cross-section with an inner angle θ that falls within a predetermined range over the photodetection region and the signal processing region through anisotropic etching, (3) forming a MOSFET, including a source and a drain doped with an n-type dopant or a p-type dopant and a gate formed of poly-silicon, using the nanowire of the signal processing region, and forming a photodetector by implanting a dopant into the nanowire of the photodetection region, and (4) patterning an electrode for connecting the MOSFET and the photodetector on a dielectric layer that covers the photodetection region and the signal processing region.

Also, (2) may include: forming at least two recesses over the photodetection region and the signal processing region by etching the substrate, forming at least one nanowire structure, a width of which is increased toward a top and a bottom from a center in a thickness direction by subjecting a portion of the substrate between the recesses to anisotropic etching, and forming the nanowire on an upper surface of the substrate by insulating the top and the bottom from each other by an silicon dioxide film formed through a wet oxidation process.

Also, (3) may include: forming a silicon dioxide on a region of the substrate other than the photodetection region and the signal processing region, implanting an n-type or p-type dopant into the nanowire of the signal processing region to form a p-well or an n-well, and diffusing the n-type or p-type dopant through annealing, forming a gate by patterning the gate oxide film and the poly-silicon layered on the nanowire of the signal processing region, implanting an n-type or p-type dopant into the nanowire of the photodetection region, and implanting a high-concentration dopant into the nanowire of the signal processing region to form the source and the drain.

Also, the forming the gate may include: forming the gate oxide film and the poly-silicon on the nanowire of the signal processing region, forming a photoresist pattern on a region where the nanowire and the gate is to be formed, and dry-etching poly-silicon to form the gate and removing the photoresist.

Also, (4) may include: forming a silicide by depositing a metal on surfaces of the source, the drain, the gate and both ends of the nanowire, and performing annealing, forming a dielectric layer having therein a contact hole corresponding to the silicide, and depositing the electrode on the dielectric layer, performing annealing, and patterning the electrode by dry etching.

Also, the forming the silicide may include: depositing a silicide metal on surfaces of the source, the drain, the gate and both ends of the nanowire, and annealing the metal and removing an unreacted silicide metal.

According to the present invention, the photodetector formed of a silicon nanowire has high photoelectric conversion efficiency and thus can exhibit high sensitivity even when the size of pixels is reduced in order to realize miniaturization and high resolution.

Also, since the diameter of the silicon nanowire is very small, the formation of an image sensor using the silicon nanowire is favorable in terms of reducing the size of pixels.

Also, since the silicon nanowire is formed by etching a substrate, additional processing for positioning and assembling the silicon nanowire to the substrate is obviated.

Also, when a single silicon nanowire is used to form a MOSFET and a photodetector or to form a plurality of MOSFETs, there is no need for an additional line or electrode for connecting the photodetector and the MOSFET, thus facilitating a reduction in the size of pixels.

Also, when the gate of the MOSFET is formed, a photoresist is formed on the nanowire of the photodetection region, thereby protecting the nanowire of the photodetection region from a poly-silicon etching process.

Also, as the patterned oxide film is formed in the preparation of a silicide, the region where the silicide is not formed can be protected.

DETAILED DESCRIPTION OF THE PREFERRED EMBODIMENT

Figure 1:
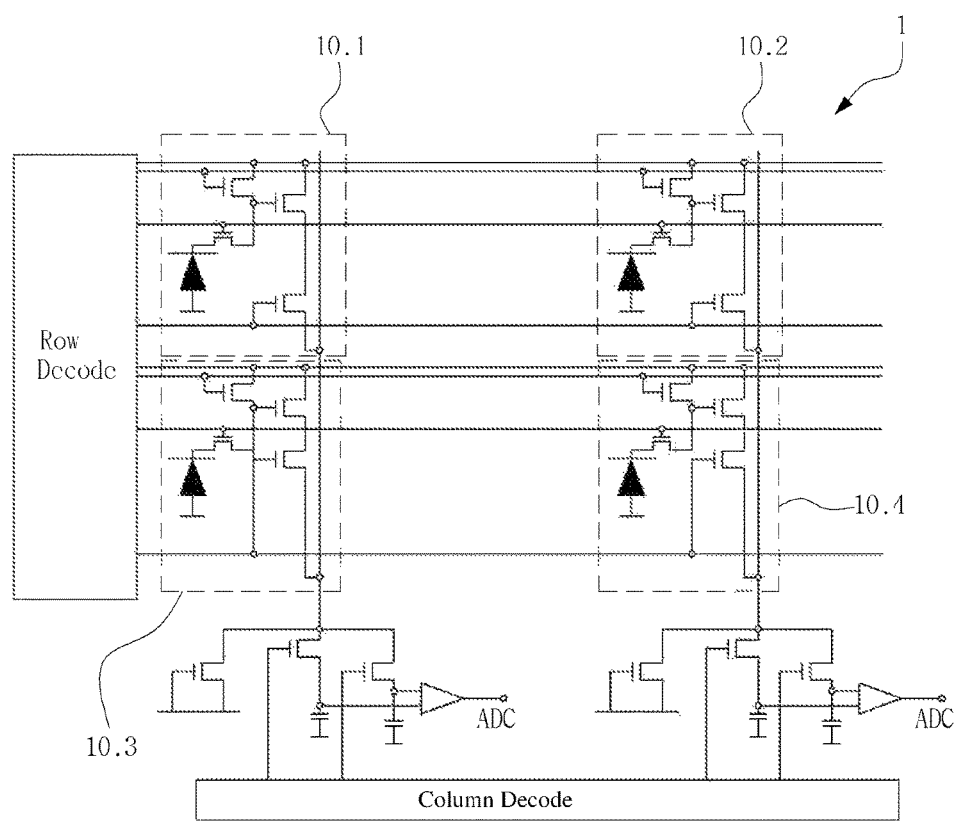
FIG. 1 is a circuit diagram of an image sensor according to the present invention.

The aspects, specific advantages and novel features of the present invention will be more clearly understood from the following detailed description and embodiments when taken in conjunction with the accompanying drawings. Wherever possible, the same reference numerals will be used throughout the drawings and the description to refer to the same or like parts. Furthermore, the terms "first," "second," "one side," "the remaining side," etc. are only used to distinguish one element from another element, and these elements should not be limited by these terms. In the following description, it is to be noted that a detailed description of the related art, when it would make the gist of the present invention unclear, will be omitted.

Hereinafter, a detailed description will be given of embodiments of the present invention with reference to the appended drawings.

Figure 2:
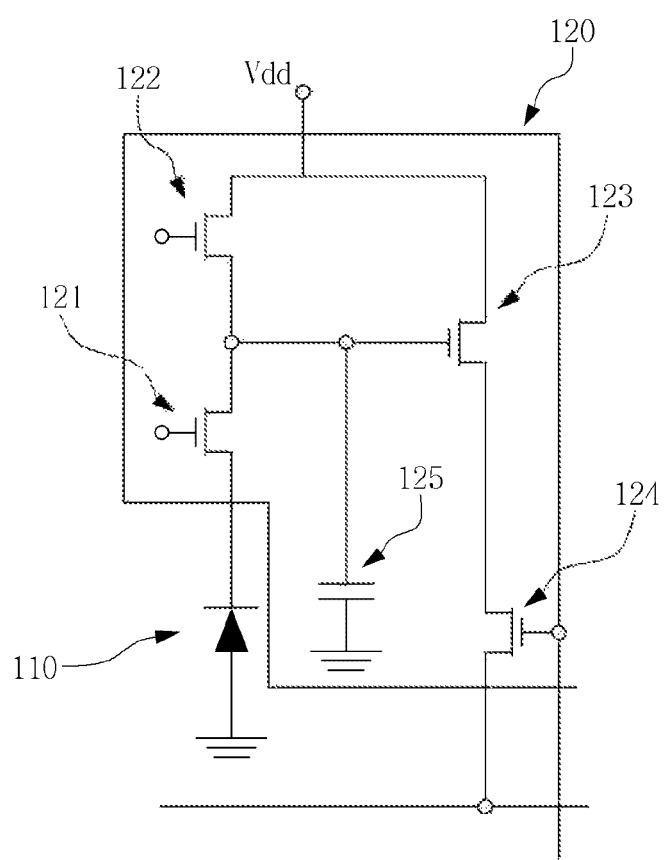
FIG. 2 is a circuit diagram illustrating unit pixel circuit of the image sensor according to the present invention.

FIG. 1 is a circuit diagram illustrating the array circuit 1 of an image sensor according to the present invention, and FIG. 2 is a circuit diagram illustrating the equivalent circuit of the unit pixel 10 included in the image sensor according to the present invention;

As illustrated in FIG. 1, an image sensor array 1 includes a plurality of pixels 10, and the pixels 10.1 to 10.4 are spaced apart from each other at predetermined intervals in a row direction and a column direction. The row decoder and the column decoder are connected to each pixel 10, so that photodetection current and a driving signal for sensing incident light are received and transmitted.

As illustrated in FIG. 2, the unit pixel 10 includes a photodetector 110 and a signal processing module 120. FIG. 2 illustrates an equivalent circuit of the unit pixel 10, but the present invention is not necessarily limited to the equivalent circuit of the unit pixel 10 illustrated in FIG. 2. The photodetector 110 senses incident light, and produces photocurrent, the magnitude of which varies depending on the intensity of incident light. The signal processing module 120 outputs photodetection current including information about the presence or absence of incident light and the intensity of incident light based on the presence or absence of photocurrent and the magnitude of photocurrent.

In an exemplary embodiment, the signal processing module 120 may include four MOSFETs 121 to 124. One end of the first MOSFET 121 is connected to one end of the second MOSFET 122 and the capacitor 125, and the remaining end of the first MOSFET 121 is connected to the photodetector 110. The remaining end of the second MOSFET 122 and one end of the third MOSFET 123 are connected to a reference voltage terminal (Vdd), and the gate 123a of the third MOSFET 123 is connected to the capacitor 125. One end of the fourth MOSFET 124 is connected to the remaining end of the third MOSFET 123, and the remaining end of the fourth MOSFET 124 is connected to the outside, thus transferring photodetection current to the outside.

The description of the photodetector 110 and the signal processing module 120 is made below, in conjunction with the description of first and second embodiments of the present invention.

Figure 3:
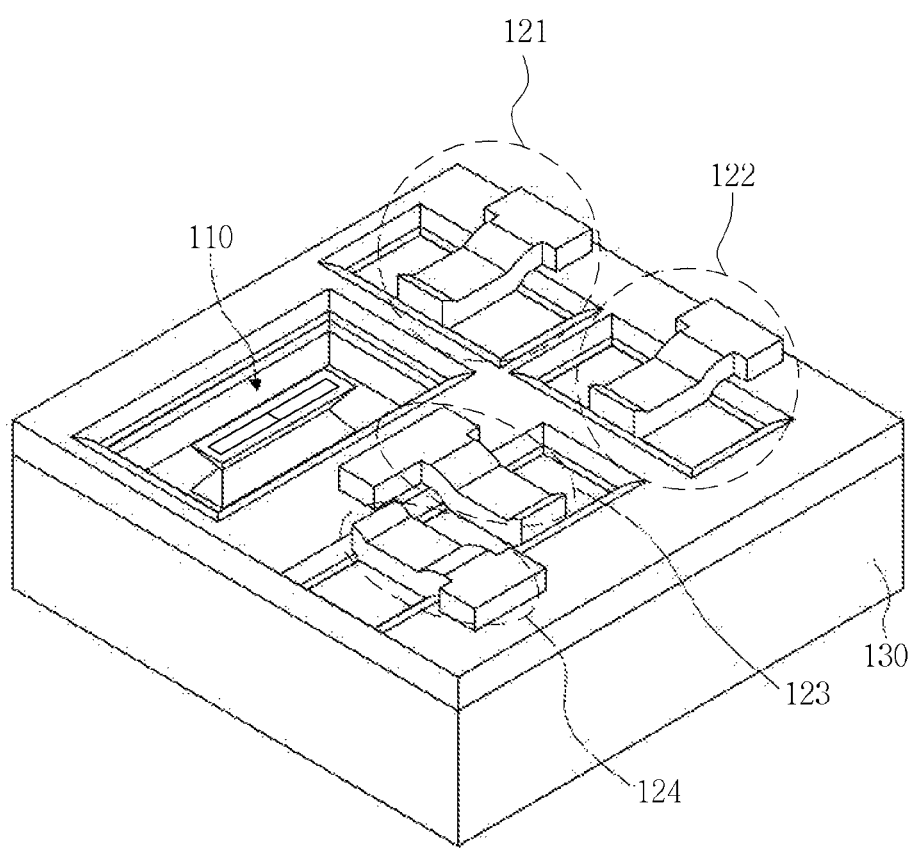
FIG. 3 illustrates a photodetector and MOSFETs included in an image sensor according to a first embodiment of the present invention.
Figure 4:
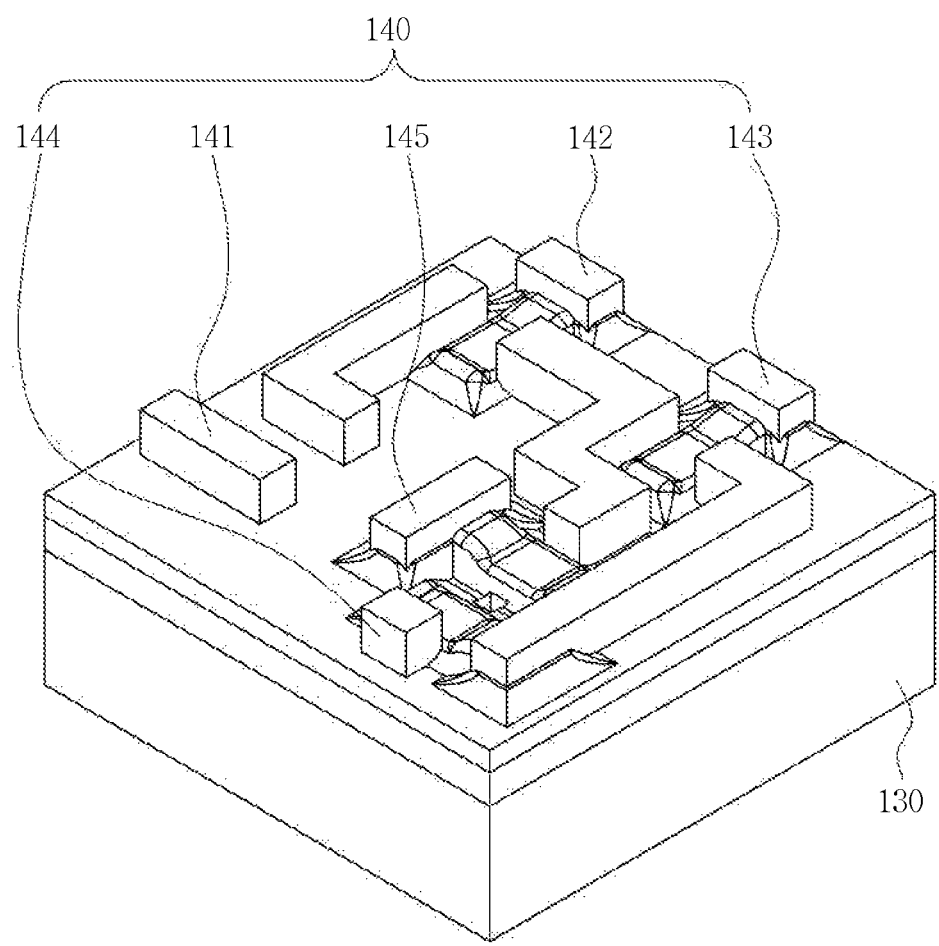
FIG. 4 illustrates an electrode included in the image sensor according to the first embodiment of the present invention.

As illustrated in FIGS. 3 and 4, the image sensor according to the first embodiment of the present invention includes a substrate 130, a photodetector 110, a signal processing module 120, and an electrode 140. As such, the photodetector 110 and the signal processing module 120 are formed on the same substrate 130, and the photodetector 110 is formed of a nanowire 160.

Figure 8:
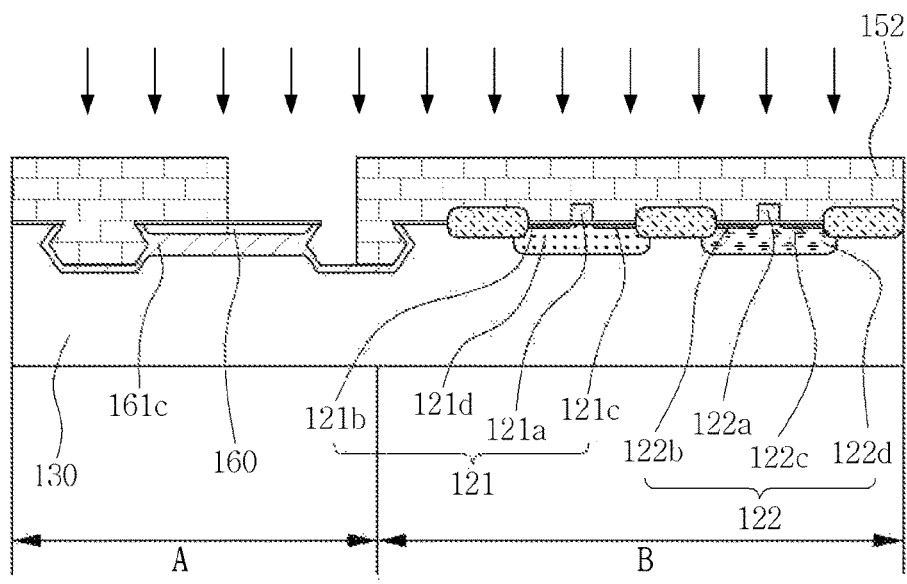
FIG. 8 illustrates the process of n doping for the formation of a p-n junction by doping the nanowire of the photodetection region when viewed from I-I', in the process of manufacturing the image sensor according to the first embodiment of the present invention.

In order to form a p-n junction between the n-type region and the p-type region in the nanowire 160 of the photodetector 110, one region of the nanowire 160 may be doped with a p-type dopant and the remaining region of the nanowire 160 may be doped with an n-type dopant (FIG. 8). Specifically, the nanowire 160 of the photodetector 110 may be doped so as to form a p-n junction, whereby the nanowire 160 may be utilized as a photodiode. In the case where the nanowire 160 operates as a photodiode, changes in photocurrent flowing through the nanowire 160 are large depending on the presence or absence of incident light, thus increasing the sensitivity of the photodetector 110 to incident light.

Figure 7:
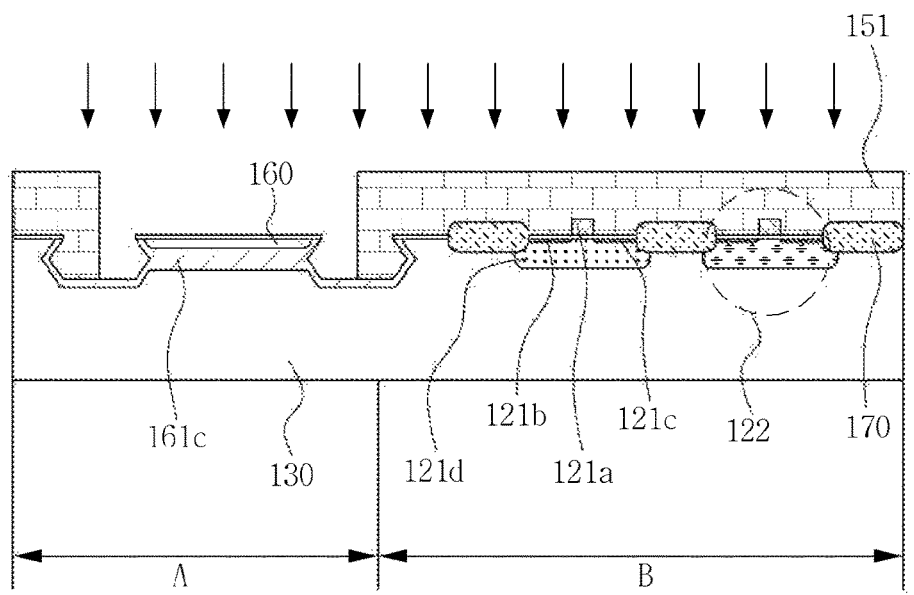
FIG. 7 illustrates the process of p doping of the nanowire of the photodetection region when viewed from I-I', in the process of manufacturing the image sensor according to the first embodiment of the present invention.

The photodetector 110 may sense incident light using the nanowire 160, which is a photoconductor. In this case, the nanowire 160 may be doped with a p-type dopant or an n-type dopant in order to function as a photoconductor (FIG. 7). Specifically, when only one type of dopant is implanted into the nanowire 160, the photoconductor may be formed, and incident light may be sensed because the resistance value of the photoconductor varies in response to incident light.

Figure 5:
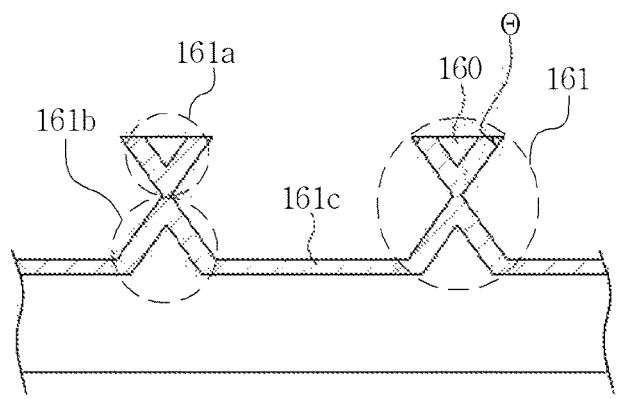
FIG. 5 illustrates a nanowire structure according to the first embodiment of the present invention.

The photodetector 110 may be formed using at least one nanowire 160. In this case, the sensitivity to incident light may be higher. As illustrated in FIG. 5, the cross-section of the nanowire 160 has an inverted triangular shape with an inner angle θ that falls within a predetermined range, and a silicon dioxide film 161c may be formed on the surface of the nanowire 160.

The nanowire 160 according to an embodiment of the present invention may be formed by etching the silicon substrate 130. When the nanowire 160 is formed by etching the substrate 130, the cross-section of the nanowire 160 is formed to have an inverted triangular shape, after which the silicon dioxide film 161c, which is an insulator, may be formed on the surface thereof, thus preventing electrical connection to the substrate 130. In the case where the nanowire 160 is fabricated separately from the substrate 130, an additional assembly process is required in order to attach the nanowire 160 to the substrate 130. However, when the nanowire 160 is formed by etching the substrate 130, as in the embodiment of the present invention, the nanowire 160 may be formed on the substrate 130, without the need for additional assembly process, and may be insulated from the substrate 130.

As described above, the signal processing module 120 outputs photodetection current that includes information about the presence or absence of incident light and the intensity of incident light based on the presence or absence of photocurrent and the magnitude thereof. The signal processing module 120 may include first to fourth MOSFETs 121 to 124 and a capacitor 125. As illustrated in FIG. 3, such a module is formed on the same substrate 130 as the photodetector 110. The present invention is not limited to the configuration of the first to fourth MOSFETs 121 to 124 illustrated in FIG. 3. Any configuration may be applied to the embodiment of the present invention, so long as photocurrent is received and a light output signal including information about the incident light may be transmitted to the outside.

As illustrated in FIG. 4, the electrode 140 functions to electrically connect the photodetector 110 and the signal processing module 120. For this, the electrode is formed on the photodetector 110 and the signal processing module 120. More specifically, the electrode 140 includes first to fifth electrodes 141 to 145. The first electrode 141 functions to ground the photodetector 110, and the second electrode 142 is connected to the gate 121a of the first MOSFET 121 in order to receive the driving signal of the first MOSFET 121 from the outside. The third electrode 143 is connected to the gate 122a of the second MOSFET 122 in order to receive the driving signal of the second MOSFET 122 from the outside, and the fourth and fifth electrodes 144, 145 are connected respectively to the remaining end of the fourth MOSFET 124 and to the gate, whereby photodetection current is transmitted to the outside in response to the driving signal of the fourth MOSFET 124.

Figure 28A:
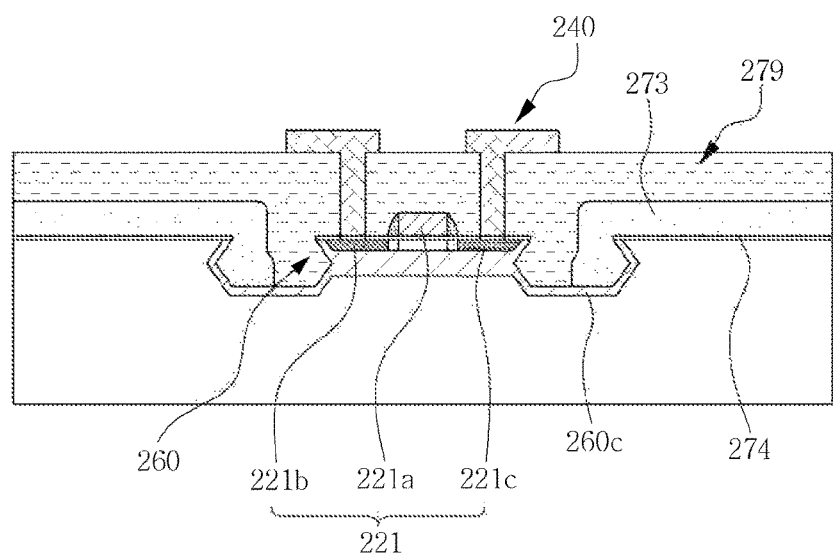
FIG. 28A is a cross-sectional view when viewed from A-A', illustrating the formation and patterning of the electrode, in the process of manufacturing the image sensor according to the second embodiment of the present invention.
Figure 28B:
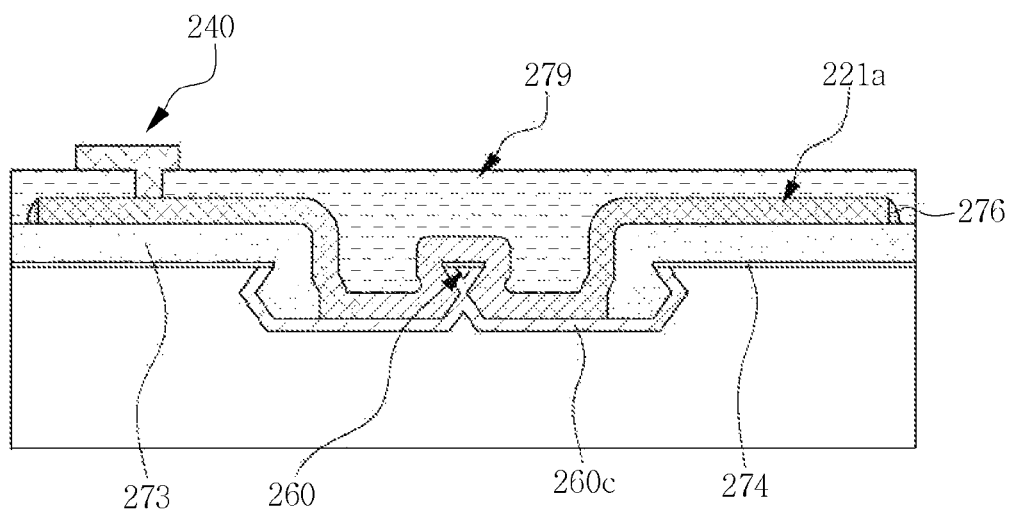
FIG. 28B is a cross-sectional view thereof when viewed from B-B'.

The electrode 140 is formed on a dielectric layer that covers the photodetector 110 and the MOSFETs 121 to 124. Specifically, a contact hole is formed in the dielectric layer, and the electrode is inserted into the contact hole, thereby interconnecting the photodetector 110 and the terminals of the MOSFETs 121 to 124 (FIGS. 28A and 28B). A detailed description thereof is given below, in conjunction with the method of manufacturing the image sensor.

Figure 6:
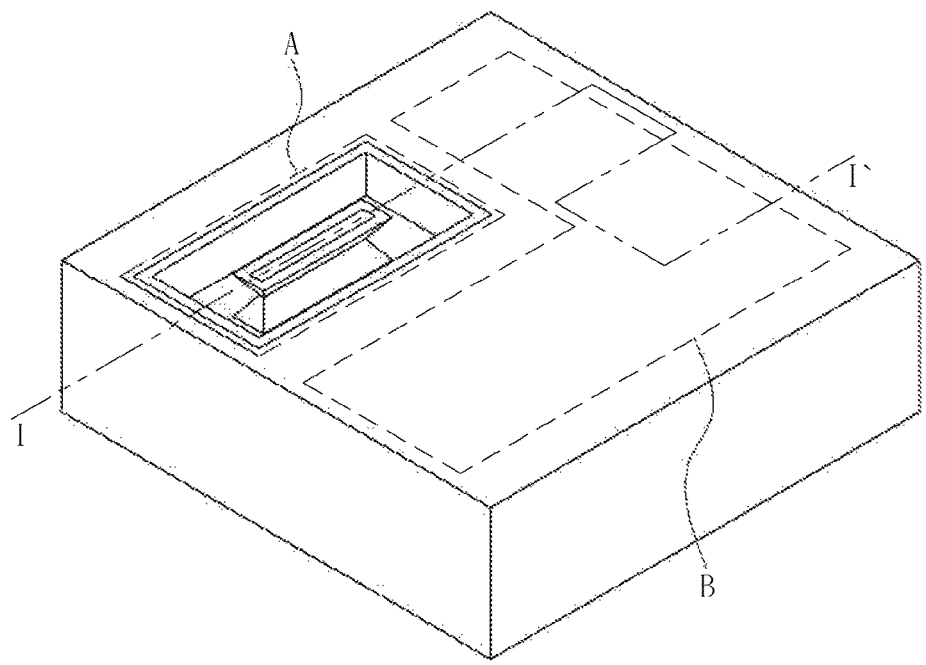
FIG. 6 illustrates the formation of a nanowire of a photodetection region, in the process of manufacturing the image sensor according to the first embodiment of the present invention.

FIGS. 6 to 8 illustrate the process of manufacturing the image sensor according to the first embodiment of the present invention. In the method of manufacturing the image sensor according to the first embodiment, any description that overlaps the description of the image sensor according to the first embodiment is given briefly, or is omitted.

Figure 13:
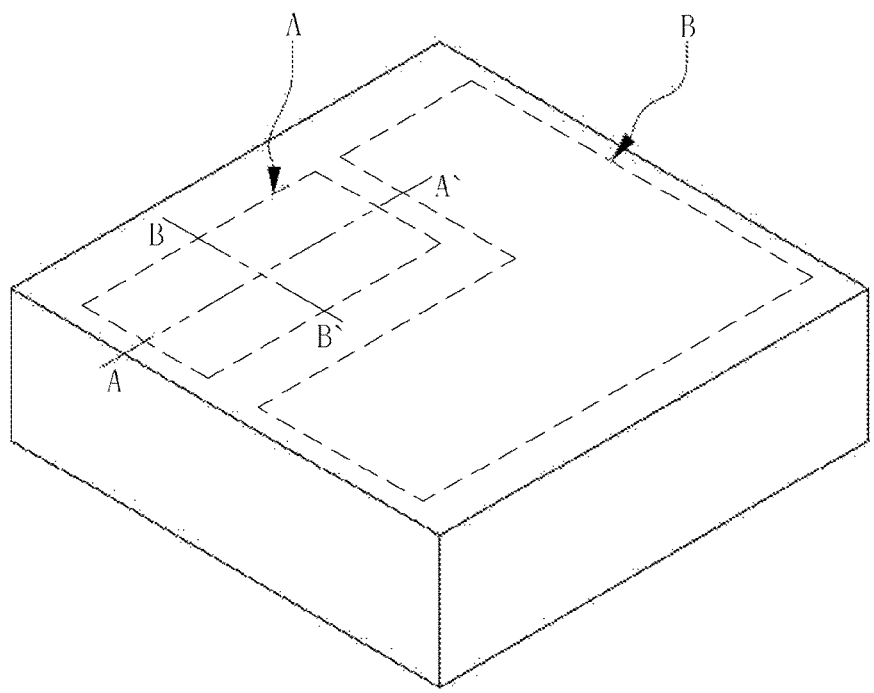
FIG. 13 illustrates the preparation of a substrate in the process of manufacturing the image sensor according to the second embodiment of the present invention.

Specifically, an insulating silicon substrate 130 including a photodetection region A and a signal processing region B is prepared (FIG. 13). Next, a silicon dioxide film 272 and a silicon nitride film 271 are sequentially layered on the substrate 130. The substrate 130 is etched to a predetermined depth to form at least two recesses 270. Next, the portion of the substrate 130 between the recesses 270 is subjected to anisotropic etching, thus forming a nanowire structure 161, the width of which gradually increases toward the top 161a and the bottom 161b from the center in a thickness direction (FIG. 15B). The substrate 130 is subjected to wet oxidation so as to insulate the top 161a and the bottom 161b of the nanowire structure 161, whereby a silicon dioxide film 161c is formed on the surface. Consequently, the nanowire 160 illustrated in FIG. 5 is formed.

Next, an oxide 273 (LOCOS; LOCal Oxidation of Si) is partially on the region of the substrate other than the photodetection region A and the signal processing region B, so as to insulate the photodetector 110 and the signal processing module 120 from each other. In order to form at least one MOSFET 121 to 124 on the substrate 130 having the photodetector 110, a p- or n-type dopant is implanted into the signal processing region B, thus forming at least one p-type well or n-type well 121d. As such, each dopant is implanted and then annealed, whereby the dopant is deeply diffused into the substrate 130.

Next, to adjust the threshold voltage of the MOSFETs 121 to 124, that is, to adjust the threshold voltage of the channel between a source 121b and a drain 121c, a dopant may be implanted into the p-type well or the n-type well 121d. For example, an n-type dopant is implanted into the p-type well 121d, and a p-type dopant is implanted into the n-type well 121d.

To form the gate 121a of the MOSFETs 121 to 124, a gate oxide film 221e and poly-silicon are deposited on the substrate 130. As such, to remove the gate oxide film and poly-silicon, which cover the nanowire 160, a patterned photoresist 150 is formed on the signal processing region B, and the poly-silicon and gate oxide film are removed from the nanowire 160 using a KOH or TMAH solution. Next, the patterned photoresist 150 is newly formed on the nanowire 160 and the signal processing region B, and dry etching is performed, thus forming the gate 121a.

Next, a low-concentration dopant is implanted into the signal processing region B to form an LDD (Lightly Doped Drain). Even when the interval between the source 121b and the drain 121c is decreased to miniaturize the MOSFETs 121 to 124, malfunctions due to the decreased interval may be prevented by the LDD.

FIGS. 7 and 8 illustrate the formation of a photodiode or a photoconductor through implantation of the dopant into the nanowire 160. As illustrated in FIG. 7, the first photoresist 151 is formed on the region of the substrate other than the photodetection region A to thus expose the nanowire 160 to the outside, after which the first dopant is implanted. When any one type of dopant is implanted into the nanowire 160, the nanowire 160 becomes a photoconductor, the resistance value of which varies in response to incident light.

As illustrated in FIG. 8, the second photoresist 152 is formed on one region of the nanowire 160, thus exposing the remaining region of the nanowire to the outside. Next, the second dopant, which is different from the first dopant, is implanted into the remaining region, whereby a p-n junction may be formed in the nanowire 160. The nanowire 160, subjected to the processes of FIGS. 7 and 8, may operate as a photodiode.

Next, an oxide film is formed on the substrate 130 and is then etched, thereby forming spacers 276 on both sides of the gate. A high-concentration conductive dopant is implanted into the n-type or p-type well 121d, thus forming the source 121b and the drain 121c, followed by annealing, thereby diffusing each dopant, ultimately forming the photodetector 110 and the MOSFETs 121 to 124 as shown in FIG. 3.

After the formation of the source 121b and the drain 121c of the MOSFET 121, a silicide is formed on the nanowire 160 of the photodetection region A and the MOSFET 121. As such, a silicide is formed on the region that contacts the electrode 140. Therefore, the silicide is formed on both ends of the nanowire 160 that contacts the electrode 140, and on the terminals of the source 121b, the drain 121c and the gate 121a of the MOSFET 121. The oxide film is formed on the substrate 130, the photoresist 150 is formed, and the photoresist 150, corresponding to the region where the silicide is to be formed, is removed. Thereafter, the oxide film is subjected to dry etching, thus exposing the region that contacts the electrode 140. This serves to protect the region through the oxide film to prevent damage in subsequent silicide processing. A metal is deposited on the exposed region, that is, on the region where the silicide is to be formed, and annealing is performed twice, thereby forming the silicide. As such, the silicide metal may be any one of Ti, Co, and Ni.

Finally, a dielectric layer having a contact hole is formed on the substrate. The electrode 140 is formed on the dielectric layer. As such, the electrode 140 is inserted into the contact hole, whereby the nanowire 160 and the MOSFETs 121 to 124 are connected to each other. Next, the electrode 140 formed on the outer surface is patterned through dry etching and photolithography, thus forming the electrode 140 as illustrated in FIG. 4.

FIGS. 9 to 12 illustrate an image sensor according to a second embodiment of the present invention. Any description of the image sensor according to the second embodiment that overlaps the description of the image sensor according to the first embodiment is given briefly, or is omitted.

Figure 9:
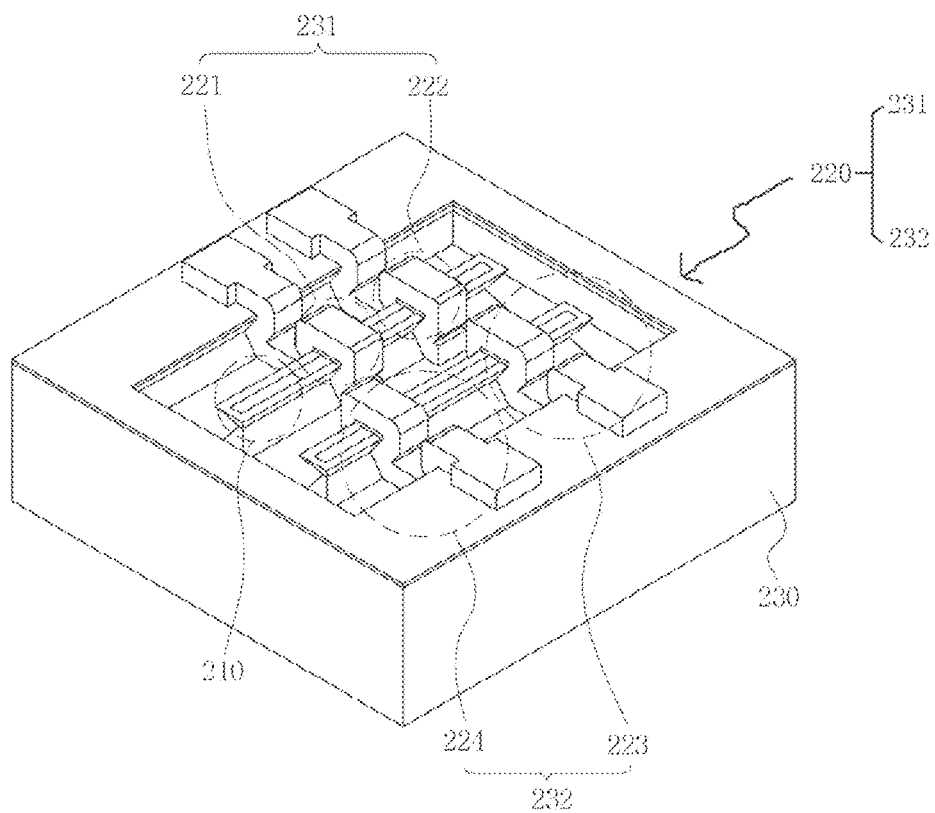
FIG. 9 illustrates a photodetector and a MOSFET included in an image sensor according to a second embodiment of the present invention.
Figure 10:
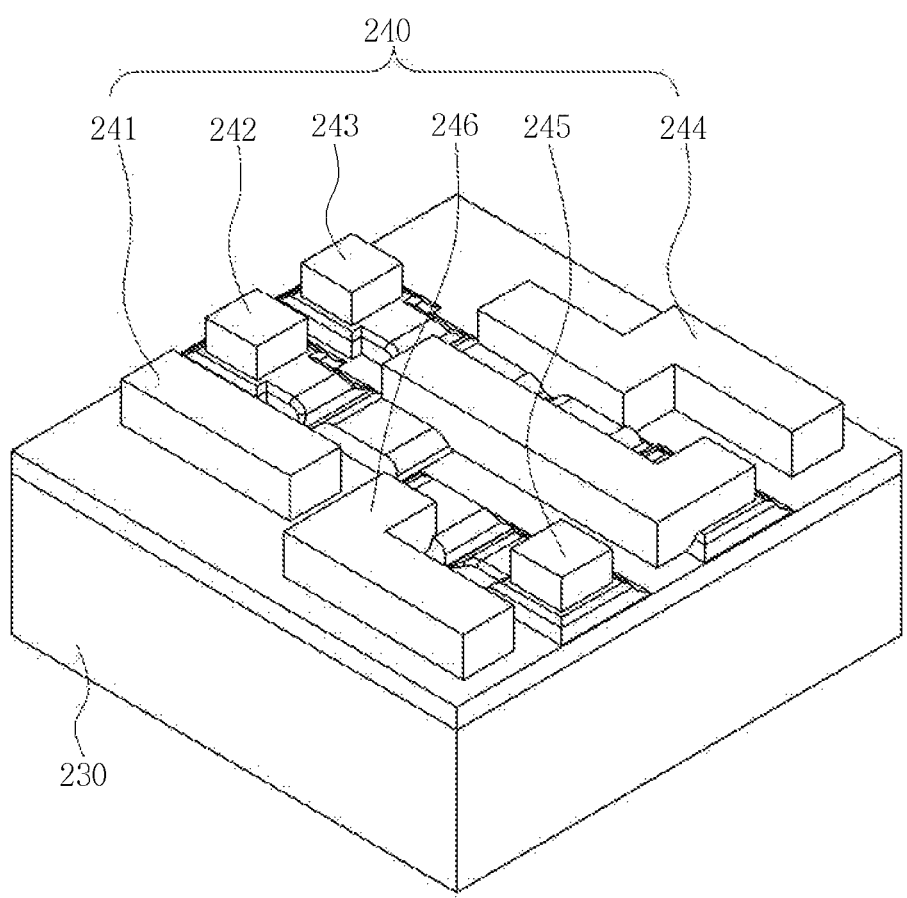
FIG. 10 illustrates an electrode included in the image sensor according to the second embodiment of the present invention.

As illustrated in FIGS. 9 and 10, the image sensor according to the second embodiment of the present invention includes a substrate 230, a photodetector 210, a signal processing module 220, and an electrode 240. As such, the photodetector 210 and the signal processing module 220 are formed on the same substrate 230, and the photodetector 210 and the MOSFETs included in the signal processing module 220 are formed of a nanowire 260.

The nanowire 260 included in the photodetector 210 may be a photodiode or a photoconductor depending on the doping of a dopant. When the nanowire 260 is a photodiode, one region of the nanowire 260 is doped with a p-type dopant and the remaining region of the nanowire 260 is doped with an n-type dopant so as to form a p-n junction between the n-type region and the p-type region (FIG. 8). When the nanowire 260 is a photoconductor, the nanowire 260 is doped with a p-type dopant or an n-type dopant (FIG. 7). Briefly, the photoconductor may be formed by implanting only one type of dopant into the nanowire 260. Since the resistance value of the photoconductor varies in response to incident light, incident light may be sensed.

The photodetector 210 may be formed using at least one nanowire 260. In this case, the sensitivity to incident light may increase.

The signal processing module 220 may include one or more MOSFETs 221 to 224 and a capacitor 225. As such, each of the MOSFETs 221 to 224 is formed of a silicon nanowire 260 on the substrate 230, and the signal processing module 220 detects photodetection current including information about the presence or absence of incident light and the intensity of incident light, based on the voltage of the capacitor 225, which varies depending on the magnitude of the photocurrent.

Figure 11:
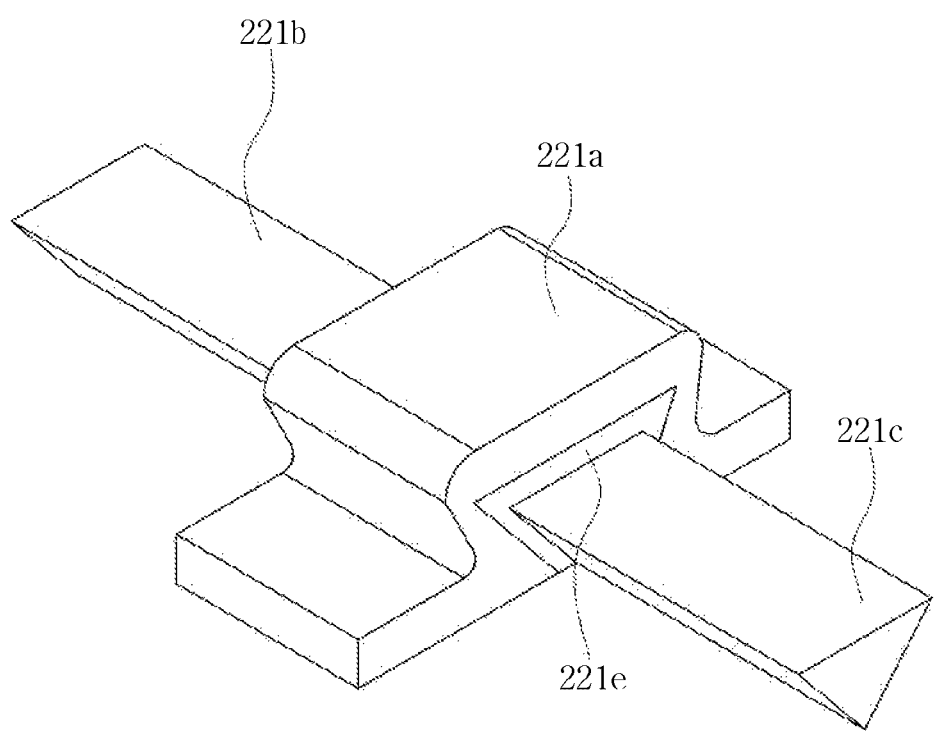
FIG. 11 illustrates a MOSFET formed of a nanowire according to the second embodiment of the present invention.

FIG. 11 illustrates the MOSFETs 221 to 224, which are included in the signal processing module 220 and are formed of the nanowire 260. The MOSFETs 221 to 224 according to the second embodiment of the present invention include a source 221b, a drain 221c, and a gate 221a. The source 221b is formed by implanting a dopant into one end of the nanowire 260, and the drain 221c is formed by implanting a dopant into the remaining end of the nanowire 260. The gate 221a is formed using a poly-silicon 275 on the gate oxide film 221e, formed at the center of the nanowire 260, namely between the source 221b and the drain 221c.

Figure 12:
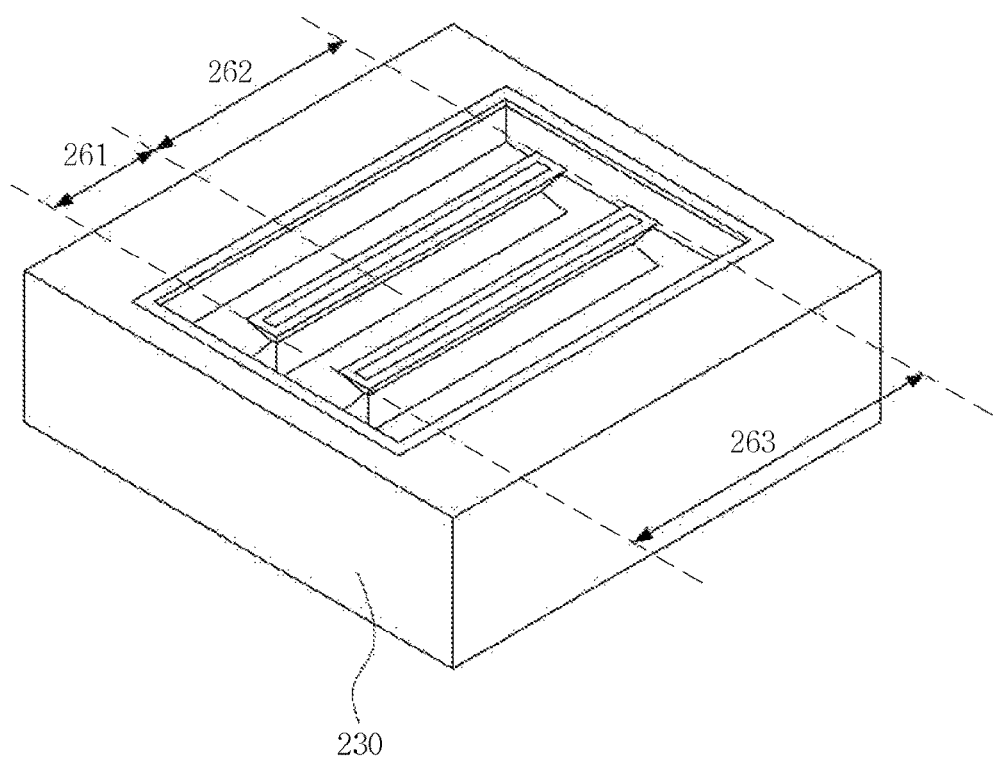
FIG. 12 illustrates first to third nanowires according to the second embodiment of the present invention.

The signal processing module 220 includes a first MOSFET circuit 231, formed of a second nanowire 262, and a second MOSFET circuit 232, formed of a third nanowire 263. The first MOSFET circuit 231 is formed of the second nanowire 262, which is arranged continuously in the longitudinal direction from one end of the first nanowire 261 on which the photodetector 210 is formed. For the nanowire 260, the first nanowire 261 is configured such that the photodetector 210 is formed, and the second nanowire 262 is configured such that one or more MOSFETs 221 to 224 are formed. As illustrated in FIG. 12, the first nanowire 261 and the second nanowire 262 are connected to each other and are continuously arranged. That is, the photodetector 210 and the MOSFETs 221 to 224 may be formed using one nanowire 260.

Also, the second MOSFET circuit 232 may be formed using the third nanowire 263. That is, a plurality of MOSFETs 221 to 224 may be disposed in the longitudinal direction using one nanowire 260. As such, the third nanowire 263 is spaced apart from the first nanowire 261 at a predetermined interval in a width direction, as illustrated in FIG. 12.

The present invention is not limited by the configuration of the nanowire 260, the photodetector 210 and the MOSFETs 221 to 224 illustrated in FIGS. 9 and 12, and the photodetector 210 and the MOSFETs 221 to 224 formed of the nanowire 260 may be variously configured. For example, one nanowire 260 may be configured such that the photodetector 210 is formed, and four MOSFETs 221 to 224 may be sequentially formed in the longitudinal direction. Furthermore, the photodetector 210 and the MOSFETs 221 to 224 may be formed by disposing a plurality of nanowires 260 parallel to each other.

In the case where a plurality of electronic devices (photodetectors, MOSFETs) are formed using one nanowire 260, individual electronic devices may be interconnected to each other, thus eliminating or reducing the need for the electrode 240 or the line for connecting the electronic devices. Consequently, there is no need to allocate space for the electrode 240 or the line, favorably realizing miniaturization of the image sensor.

The first MOSFET circuit 231, formed of the second nanowire 262, includes a first MOSFET 221 and a second MOSFET 222. The first MOSFET 221 is spaced apart from the photodetector 210 at a predetermined interval in the longitudinal direction of the second nanowire 262. When the driving signal of the first MOSFET 221 is applied and the second MOSFET 222 is not driven, photocurrent produced from the photodetector 210 is transferred to the capacitor 225, which is connected to one end of the first MOSFET 221. As a result, when incident light is sensed by the photodetector 210, the voltage value of the capacitor 225 varies.

The second MOSFET 222 is connected to the reference voltage terminal (Vdd), and the remaining end of the second MOSFET 222 is connected to the capacitor 225. When the driving signal of the second MOSFET 222 is applied and the first MOSFET 221 is not driven, both ends of the capacitor 225 are charged with reference voltage (Vdd). Thus, the voltage of the capacitor 225 is initialized to the reference voltage (Vdd).

The second MOSFET circuit 232 includes a third MOSFET 223 and a fourth MOSFET 224, which are formed of the third nanowire 263. Since the gate of the third MOSFET 223 is connected to the capacitor 225, the photodetection current flowing through the third MOSFET 223 capacitor 225 varies depending on the voltage of the capacitor 225. Accordingly, the magnitude of the photodetection current flowing through the third MOSFET 223 varies in response to incident light, and thus the photodetection current includes information about the incident light.

The fourth MOSFET 224 is spaced apart from the third MOSFET 223 at a predetermined interval in the longitudinal direction of the third nanowire 263, and transfers photodetection current produced from the third MOSFET 223 to the outside. The fourth MOSFET 224 receives the photodetection current and transmits it to the outside when a driving signal is applied to the gate.

As such, the first to third nanowires 261 to 263 may have an inverted triangular-shaped cross-section with an inner angle θ that falls within a predetermined range, and the silicon dioxide film 260c may be formed on the surface of the nanowire 260.

Since the first to third nanowires 261 to 263 have an inverted triangular-shaped cross-section and include the silicon dioxide film 260c formed on the surface thereof, the top 260a and the bottom 260b of the nanowire structure are separated and are thus insulated from the substrate 230. As a result, the first to third nanowires 261 to 263 may be formed on the the substrate 230 by a top-down fabrication method, thus obviating an additional assembly process for attaching the nanowire 260 to the substrate 230.

As illustrated in FIG. 10, the electrode, which is used to electrically connect the photodetector 210 and the signal processing module 220 to each other, is formed on the photodetector 210 and the signal processing module 220. More specifically, the first electrode 241 is connected to a ground, and thus the photodetector 210 is grounded. The second electrode 242 is connected to the gate of the first MOSFET 221 and thus receives the driving signal of the first MOSFET 221 from the outside. The third electrode 243 is connected to the gate of the second MOSFET 222 and thus receives the driving signal of the second MOSFET 222 from the outside, and the fourth electrode 244 is connected to one end of each of the second MOSFET 222 and the third MOSFET 223 and thus transfers a reference voltage (Vdd). The fifth and sixth electrodes 245, 246 are connected respectively to the remaining end of the fourth MOSFET 224 and the gate, whereby photodetection current is transmitted to the outside in response to the driving signal of the fourth MOSFET 224.

The electrode 240 is formed on a dielectric layer that covers the photodetector 210 and the MOSFETs 221 to 224. Specifically, a contact hole is formed in the dielectric layer, and the electrode is inserted into the contact hole, thus interconnecting the photodetector and the terminals of the MOSFETs 221 to 224 (FIGS. 28A and 28B). A detailed description thereof is given below, in conjunction with the method of manufacturing the image sensor according to the second embodiment.

FIGS. 13 to 28B illustrate the process of manufacturing the image sensor according to the second embodiment of the present invention. Specifically, FIGS. 13 to 28B illustrate the process of manufacturing a first MOSFET 221 formed of a nanowire. By repeating the processes of FIGS. 13 to 28B, second to fourth MOSFETs 222 to 224 may be manufactured. Below, any description that overlaps the description of the method of manufacturing the image sensor according to the first embodiment of the present invention is omitted or is given briefly.

The method of manufacturing the image sensor according to the second embodiment of the present invention includes (1) preparing a substrate, (2) forming a nanowire, (3) forming MOSFETs 221 to 224 and a photodetector 210, and (4) forming an electrode 240. Individual procedures are specified below with reference to the appended drawings.

In the preparation of the substrate (1), a substrate 230 for manufacturing an image sensor is prepared. As illustrated in FIG. 13, the substrate 230 includes a photodetection region A and a signal processing region B. The photodetection region A indicates a region where the photodetector 210 is to be formed, and the signal processing region B indicates a region where the signal processing module 220, including a plurality of MOSFETs 221 to 224, is to be formed.

In the formation of the nanowire (2), the nanowire 260, formed through anisotropic etching and having an inverted triangular-shaped cross-section, is formed over the photodetection region A and the signal processing region B. The formation of the nanowire (2) is described with reference to the drawings.

Figure 14A:
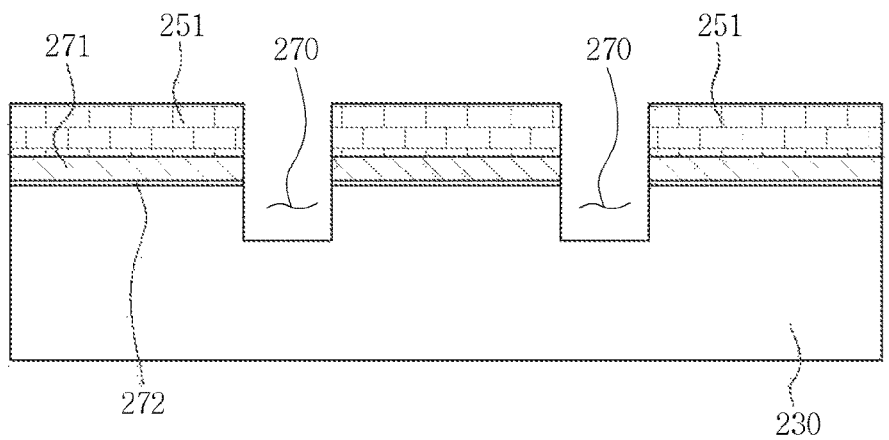
FIG. 14A is a cross-sectional view when viewed from A-A', illustrating the formation of recesses in the substrate, in the process of manufacturing the image sensor according to the second embodiment of the present invention.
Figure 14B:
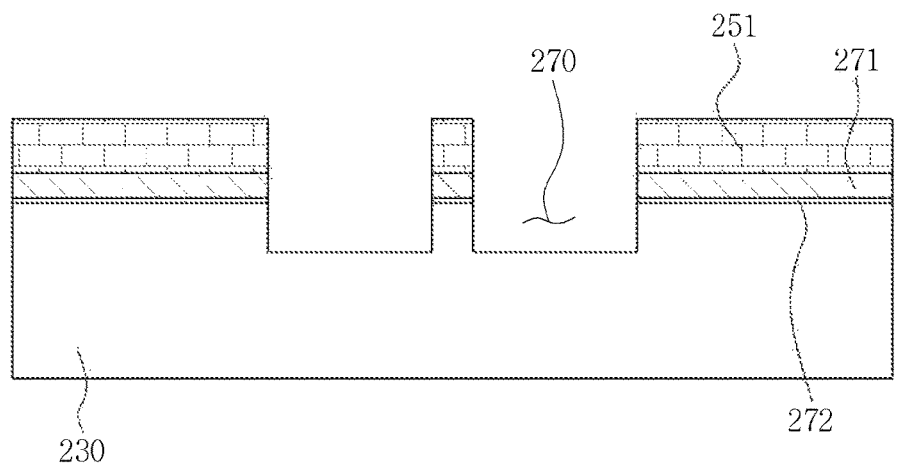
FIG. 14B is a cross-sectional view thereof when viewed from B-B'.

As illustrated in FIGS. 14A (a cross-sectional view taken along the line A-A' of FIG. 13) and 14B (a cross-sectional view taken along the line B-B' of FIG. 13), the substrate 230, on which a first photoresist 251, a silicon nitride film 271 and a silicon dioxide film 272 are layered, is etched, thus forming at least two recesses 270 over the photodetection region A and the signal processing region B. As such, the number of recesses 270 corresponds to the number of nanowires 260, which are spaced apart from each other. In the second embodiment of the present invention, the substrate 230 requires three recesses 270 because two nanowires 260 are formed.

Figure 15A:
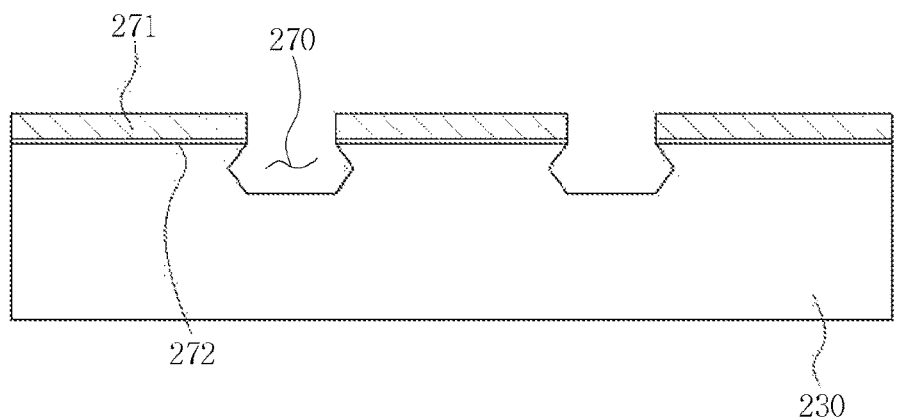
FIG. 15A is a cross-sectional view when viewed from A-A', illustrating the formation of a nanowire structure, in the process of manufacturing the image sensor according to the second embodiment of the present invention.
Figure 15B:
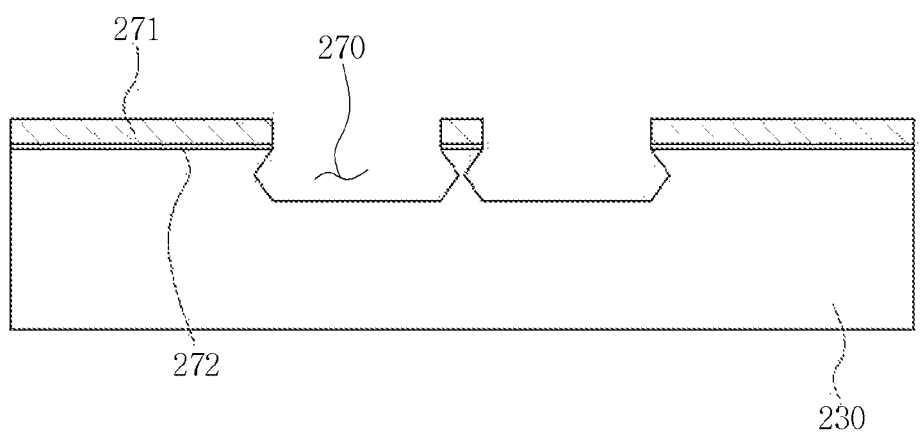
FIG. 15B is a cross-sectional view thereof when viewed from B-B'.

As illustrated in FIGS. 15A (a cross-sectional view taken along the line A-A' of FIG. 13) and 15B (a cross-sectional view taken along the line B-B' of FIG. 13), the portion of the substrate 230 between the recesses 270 is subjected to anisotropic etching, thereby forming at least one nanowire 260 structure, the width of which is increased toward the top and the bottom from the center in a thickness direction. Here, the anisotropic etching is performed using a KOH or TMAH solution.

Figure 16A:
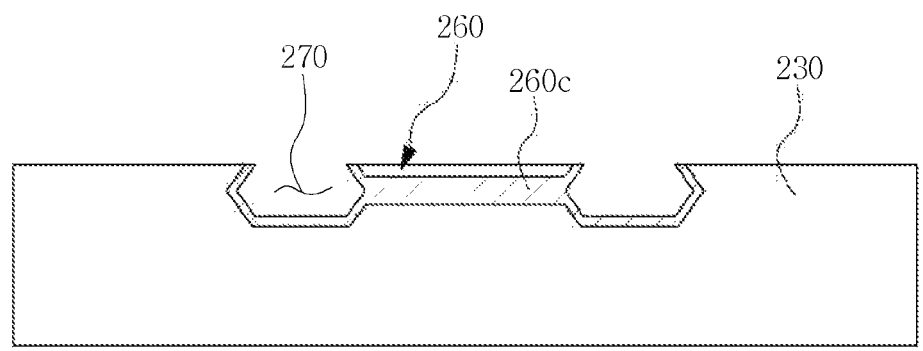
FIG. 16A is a cross-sectional view when viewed from A-A', illustrating the formation of a silicon nanowire through a wet oxidation process and a silicon nitride film removal process, in the process of manufacturing the image sensor according to the second embodiment of the present invention.
Figure 16B:
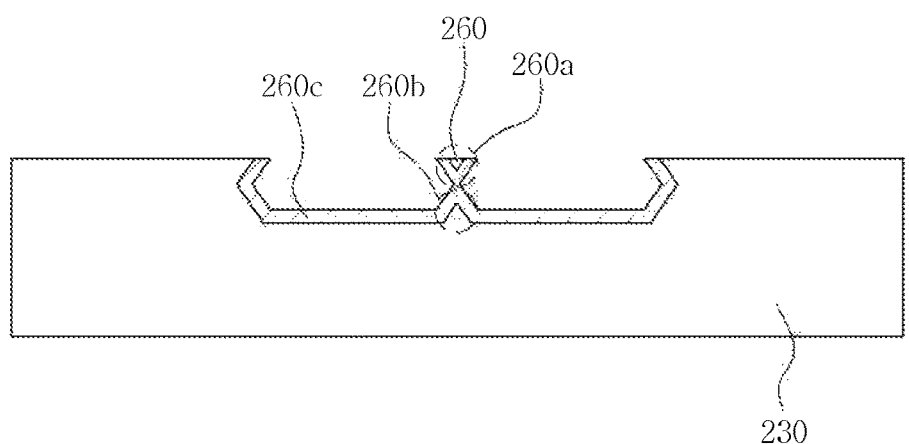
FIG. 16B is a cross-sectional view thereof when viewed from B-B'.

As illustrated in FIGS. 16A (a cross-sectional view taken along the line A-A' of FIG. 13) and 16B (a cross-sectional view taken along the line B-B' of FIG. 13), a silicon dioxide film 260c is formed on the surface of the nanowire 260 structure through a wet oxidation process. The oxide film 260c, which is an insulator, is formed between the top 260a and the bottom 260b of the structure, thereby insulating the top 260a and the bottom 260c from each other, and thus the nanowire 260, corresponding to the top 260a of the nanowire 260 structure, is insulated from the substrate 230.

In the formation of the MOSFETs and the photodetector (3), MOSFETs 261 to 264, including a source and a drain 221c, which are doped with an n-type dopant or a p-type dopant, and a gate 221a, which is formed of poly-silicon, are formed on the nanowire 260 of the signal processing region B, and the dopant is implanted into the nanowire 260 of the photodetection region A, thus forming a photodetector 210, which is described in detail with reference to the drawings.

Figure 17A:
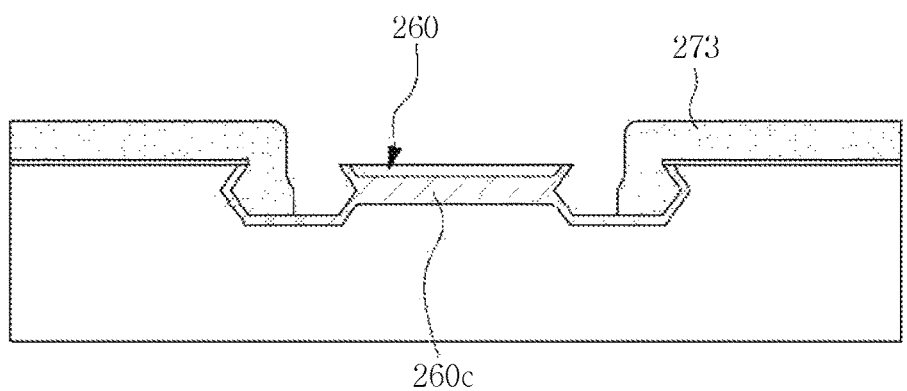
FIG. 17A is a cross-sectional view when viewed from A-A', illustrating the formation of a silicon dioxide film on the region of the substrate other than the photodetection region and the signal processing region, in the process of manufacturing the image sensor according to the second embodiment of the present invention.
Figure 17B:
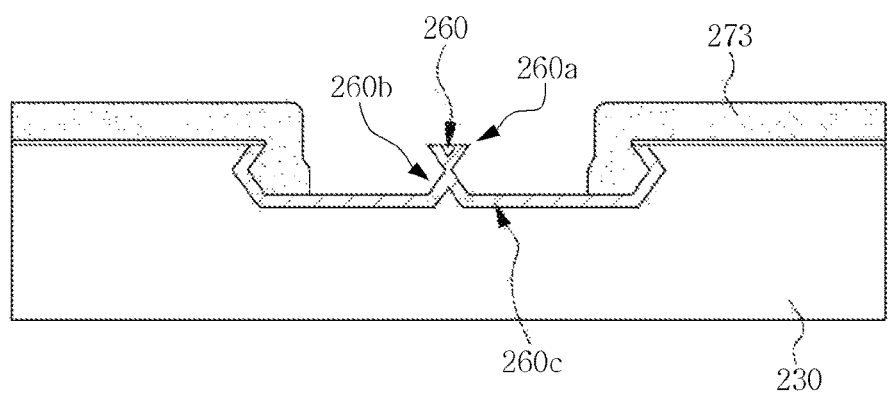
FIG. 17B is a cross-sectional view thereof when viewed from B-B'.

As illustrated in FIGS. 17A (a cross-sectional view taken along the line A-A' of FIG. 13) and 17B (a cross-sectional view taken along the line B-B' of FIG. 13), a silicon dioxide 273 is formed on the region of the substrate other than the photodetection region A and the signal processing region B. Further, a silicon dioxide film and a silicon nitride film are partially formed on the region of the substrate 230 where the nanowire 260 is formed, that is, on the photodetection region A and the signal processing region B. Accordingly, the region of the substrate other than the photodetection region A and the signal processing region B is exposed, and the silicon dioxide 273 is formed on the exposed region through a wet oxidation process. The region of the substrate other than the photodetection region A and the signal processing region B is insulated by the silicon dioxide 273.

Figure 18A:
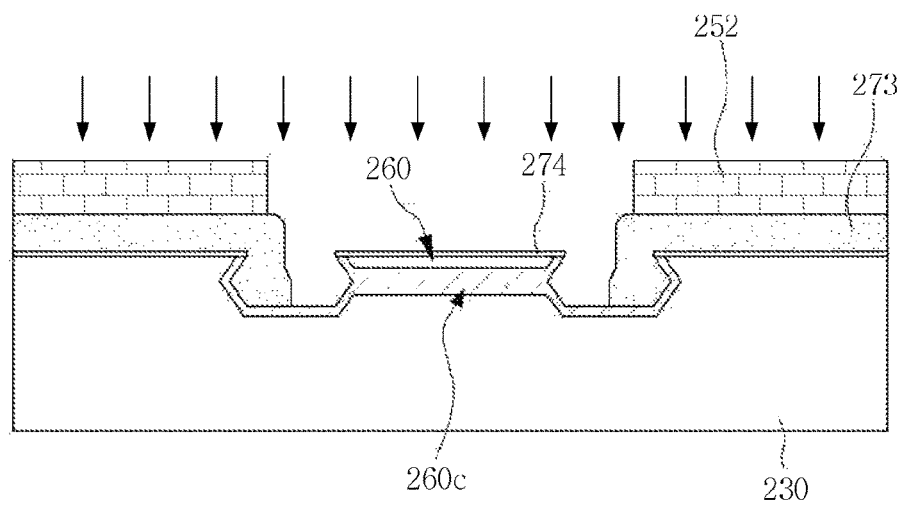
FIG. 18A is a cross-sectional view when viewed from A-A', illustrating the formation of a p-well or an n-well in the nanowire of the signal processing region, in the process of manufacturing the image sensor according to the second embodiment of the present invention.
Figure 18B:
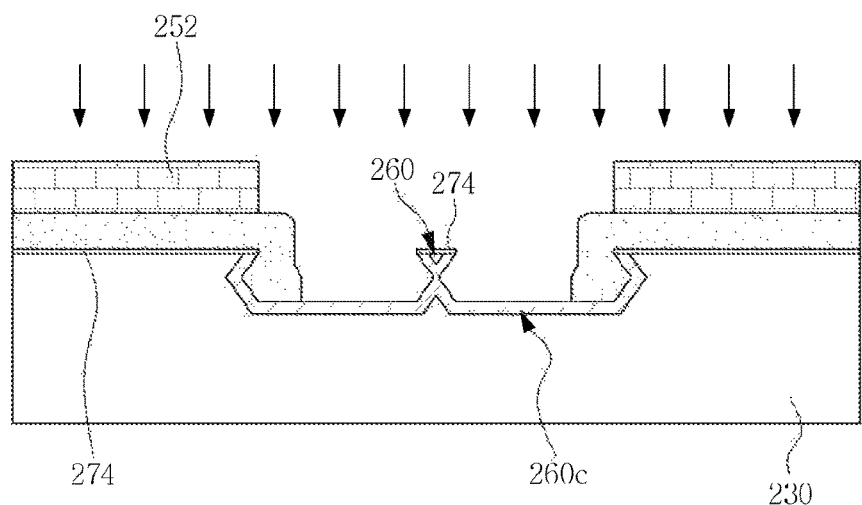
FIG. 18B is a cross-sectional view thereof when viewed from B-B'.

As illustrated in FIGS. 18A (a cross-sectional view taken along the line A-A' of FIG. 13) and 18B (a cross-sectional view taken along the line B-B' of FIG. 13), an n-type dopant or a p-type dopant is implanted into the nanowire 260 of the signal processing region B to form a p-well or an n-well, and the n-type dopant or the p-type dopant is diffused through annealing. In order to dope only the nanowire 260 of the signal processing region B, a second photoresist 252 is applied on the region other than the signal processing region B, thus exposing only the nanowire 260 of the signal processing region. When the n-well is formed, arsenic (As) or phosphorus (P) may be implanted, and when the p-well is formed, boron (B) may be implanted.

Figure 19A:
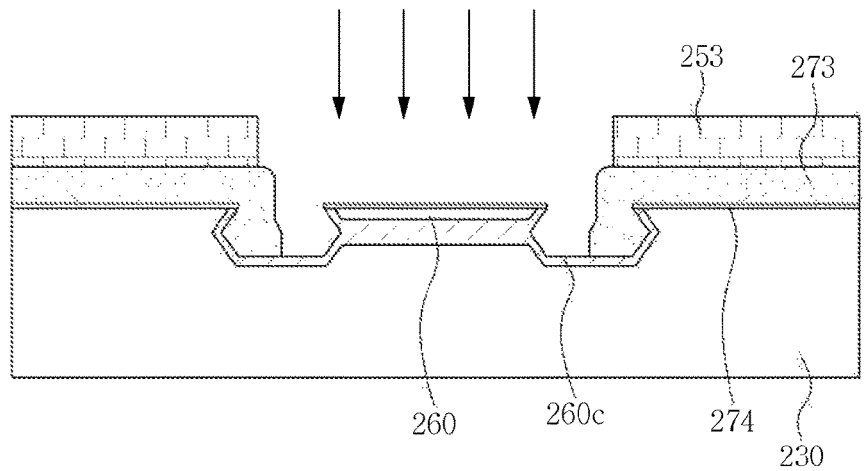
FIG. 19A is a cross-sectional view when viewed from A-A', illustrating the implantation of a dopant to adjust a threshold voltage, in the process of manufacturing the image sensor according to the second embodiment of the present invention.
Figure 19B:
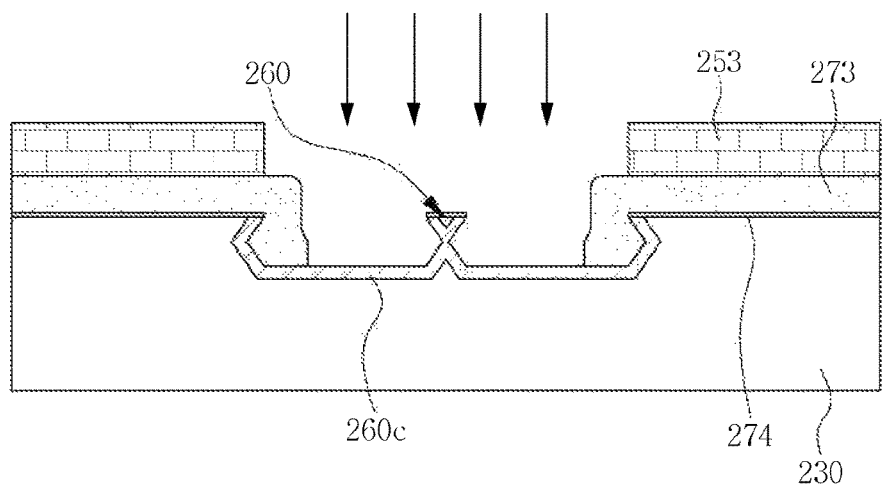
FIG. 19B is a cross-sectional view thereof when viewed from B-B'.

As illustrated in FIGS. 19A (a cross-sectional view taken along the line A-A' of FIG. 13) and 19B (a cross-sectional view taken along the line B-B' of FIG. 13), the dopant may be implanted to adjust the threshold voltage of the MOSFETs 261 to 264. Here, the threshold voltage is the minimum voltage for forming the channel of the MOSFETs 261 to 264. The p-well is formed by implanting an n-type dopant, and the n-well is formed by implanting a p-type dopant. In FIG. 19A, reference numeral 253 represents a third photoresist.

Figure 20A:
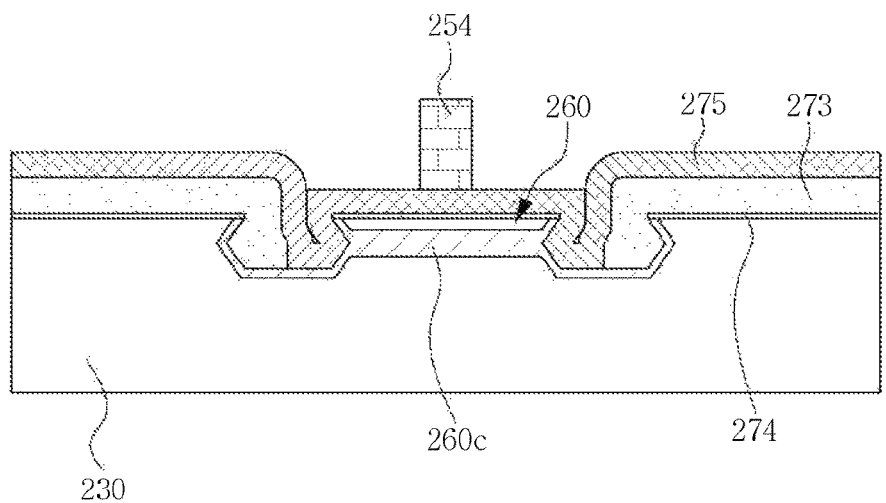
FIG. 20A is a cross-sectional view when viewed from A-A', illustrating the application of a photoresist for forming a gate, in the process of manufacturing the image sensor according to the second embodiment of the present invention.
Figure 20B:
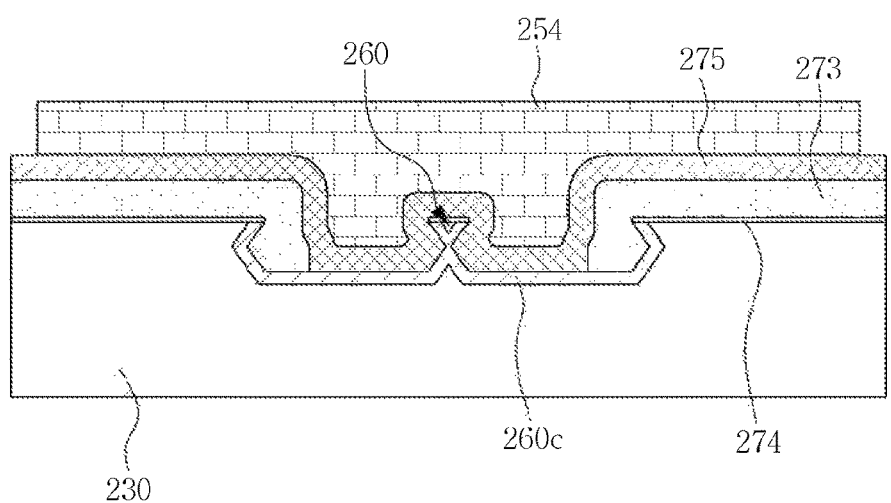
FIG. 20B is a cross-sectional view thereof when viewed from B-B'.

As illustrated in FIGS. 20A (a cross-sectional view taken along the line A-A' of FIG. 13) and 20B (a cross-sectional view taken along the line B-B' of FIG. 13), in order to form a gate 221a, a gate oxide film 221e and a poly-silicon 275 are formed on the substrate 230, after which the poly-silicon 275 of the photodetection region A, corresponding to the region other than the signal processing region B, is removed. A patterned fourth photoresist 254 is formed on the region where the gate 221a is to be formed. The fourth photoresist 254 is formed on the nanowire 260 of the photodetection region A in order to protect the nanowire 260 of the photodetection region A from subsequent etching.

Figure 21A:
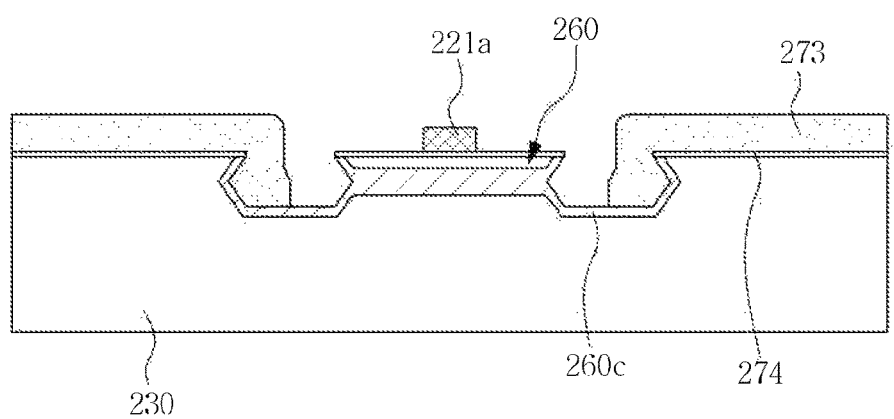
FIG. 21A is a cross-sectional view when viewed from A-A', illustrating the patterning for forming a gate, in the process of manufacturing the image sensor according to the second embodiment of the present invention.
Figure 21B:
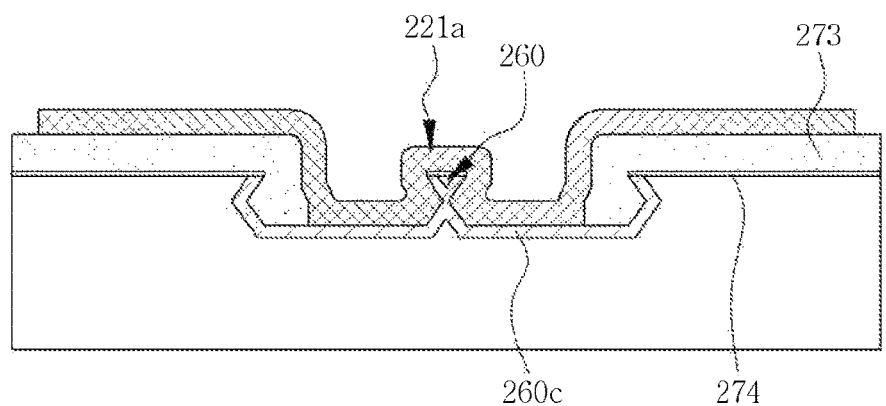
FIG. 21B is a cross-sectional view thereof when viewed from B-B'.

As illustrated in FIGS. 21A (a cross-sectional view taken along the line A-A' of FIG. 13) and 21B (a cross-sectional view taken along the line B-B' of FIG. 13), the poly-silicon is subjected to dry etching, and thus the gate 221a is formed, and the fourth photoresist 254 is removed.

Figure 22A:
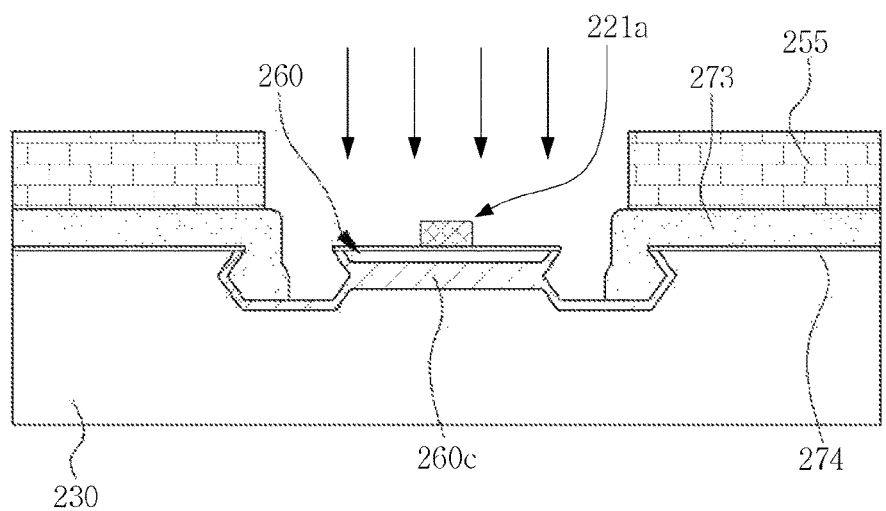
FIG. 22A is a cross-sectional view when viewed from A-A', illustrating the doping of a low-concentration dopant for forming an LDD (Lightly Doped Drain), in the process of manufacturing the image sensor according to the second embodiment of the present invention.
Figure 22B:
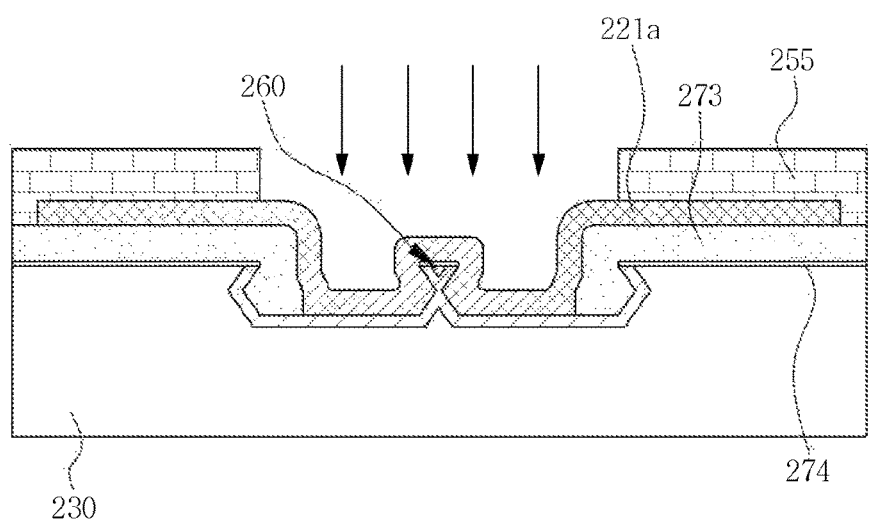
FIG. 22B is a cross-sectional view thereof when viewed from B-B'.

As illustrated in FIGS. 22A (a cross-sectional view taken along the line A-A' of FIG. 13) and 22B (a cross-sectional view taken along the line B-B' of FIG. 13), a patterned fifth photoresist 255 is formed to expose the nanowire 260 of the signal processing region B, and a low-concentration dopant is implanted into the exposed nanowire 260 of the signal processing region B to form an LDD. When the LDD is formed in this way, malfunctions resulting from decreasing the interval between the source 221*b* and the drain 221*c* due to miniaturization of the MOSFETs 261 to 264 may be prevented.

Next, a dopant is implanted into the nanowire 260 of the photodetection region A. This remains the same as in the method of manufacturing the image sensor according to the first embodiment, and is thus described briefly. When a photoconductor is manufactured, any one type of dopant is implanted into the nanowire 260 of the photodetection region A (FIG. 7), and when a photodiode is manufactured, a first dopant and a second dopant are implanted into the nanowire of the photodetection region A, thus forming a p-n junction (FIGS. 7 and 8).

Figure 23A:
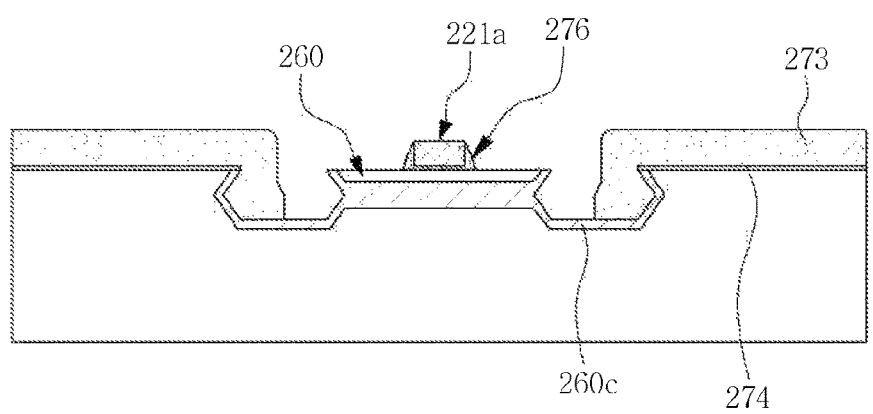
FIG. 23A is a cross-sectional view when viewed from A-A', illustrating the formation of a spacer at the lateral surface of the gate, in the process of manufacturing the image sensor according to the second embodiment of the present invention.
Figure 23B:
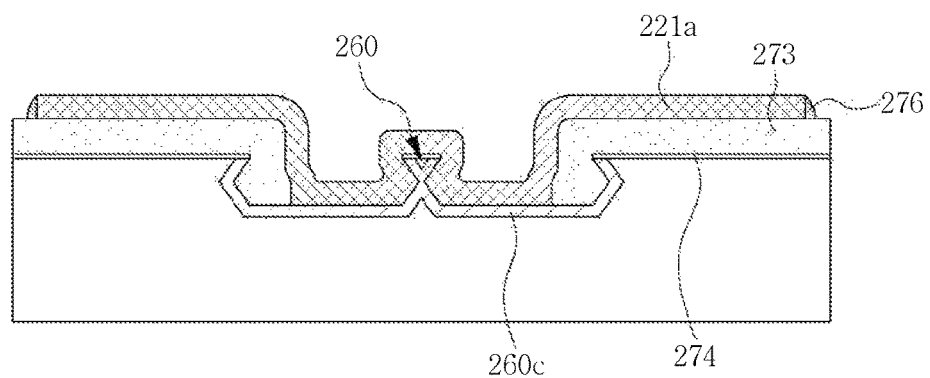
FIG. 23B is a cross-sectional view thereof when viewed from B-B'.

As illustrated in FIGS. 23A (a cross-sectional view taken along the line A-A' of FIG. 13) and 23B (a cross-sectional view taken along the line B-B' of FIG. 13), an oxide film 274 is formed on the substrate 230, and the remaining oxide film 274, other than the oxide film 274 formed on the lateral surface of the gate 221*a*, is removed through dry etching. The oxide film 274 at the lateral surface of the gate 221*a* becomes a spacer 276.

Figure 24A:
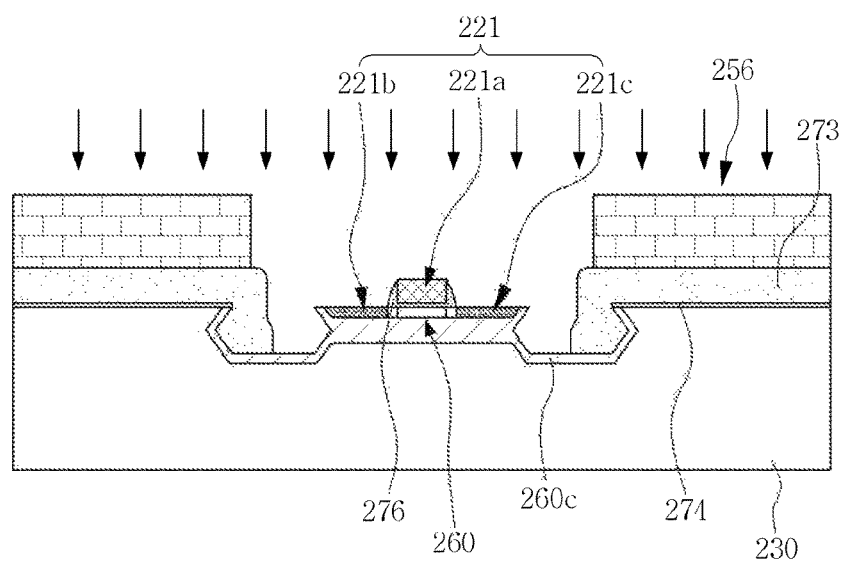
FIG. 24A is a cross-sectional view when viewed from A-A', illustrating the implantation of a high-concentration dopant for forming a source and a drain, in the process of manufacturing the image sensor according to the second embodiment of the present invention.
Figure 24B:
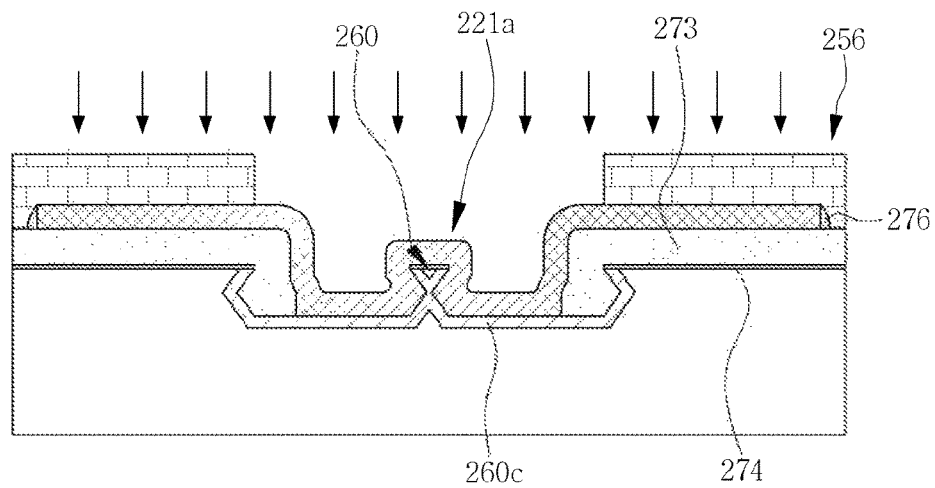
FIG. 24B is a cross-sectional view thereof when viewed from B-B'.

As illustrated in FIGS. 24A (a cross-sectional view taken along the line A-A' of FIG. 13) and 24B (a cross-sectional view taken along the line B-B' of FIG. 13), a sixth photoresist 256 is formed on the region other than the signal processing region B, thus exposing the nanowire 260 of the signal processing region B. Next, a high-concentration dopant is implanted into the nanowire 260 of the signal processing region B in order to form the source 221*b* and the drain 221*c*.

In the formation of the electrode (4), the electrode 240 for interconnecting the MOSFETs 261 to 264 and the photodetector 210 is patterned on a dielectric layer 279 that covers the photodetection region A and the signal processing region B. Here, the formation of the electrode (4) is described in detail with reference to the drawings.

Figure 25A:
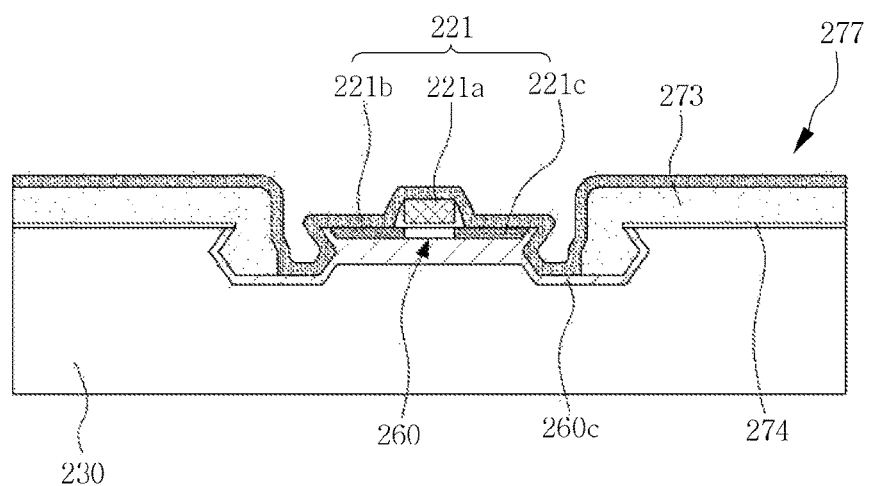
FIG. 25A is a cross-sectional view when viewed from A-A', illustrating the deposition of a metal for forming a silicide, in the process of manufacturing the image sensor according to the second embodiment of the present invention.
Figure 25B:
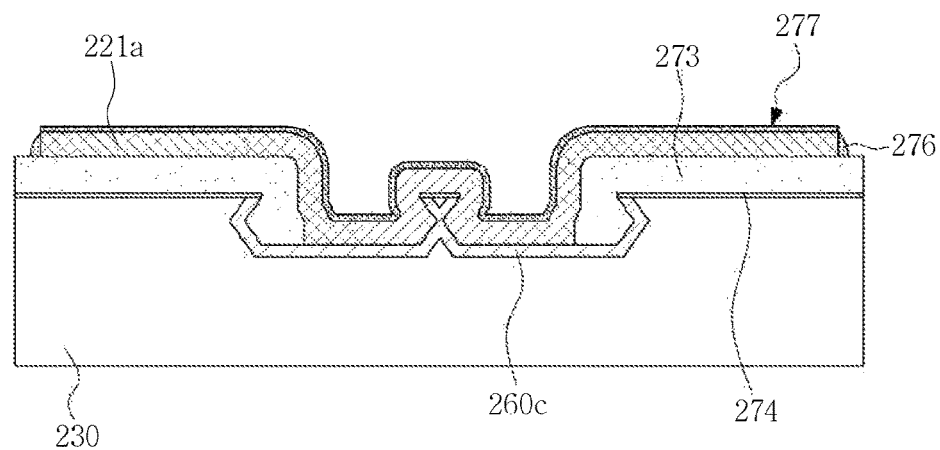
FIG. 25B is a cross-sectional view thereof when viewed from B-B'.

As illustrated in FIGS. 25A (a cross-sectional view taken along the line A-A' of FIG. 13) and 25B (a cross-sectional view taken along the line B-B' of FIG. 13), a metal layer 277 is deposited on the substrate 230 to form a silicide 278. Here, the metal may be any one of Ti, Co, and Ni.

Figure 26A:
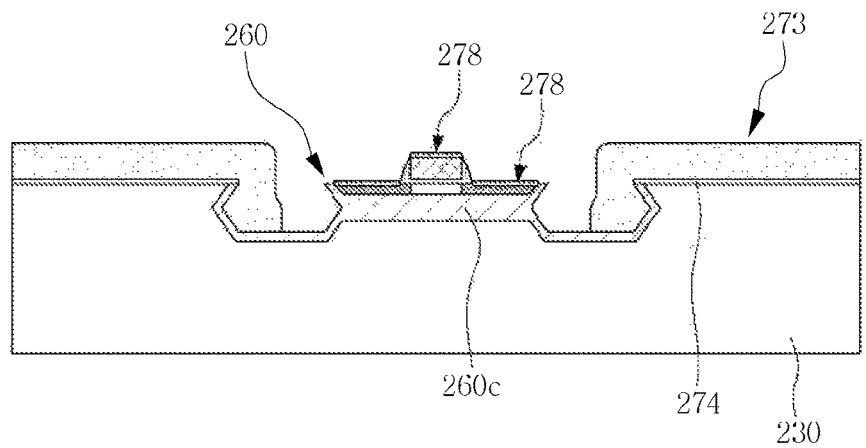
FIG. 26A is a cross-sectional view when viewed from A-A', illustrating the patterning and annealing of a metal for forming a silicide, in the process of manufacturing the image sensor according to the second embodiment of the present invention.
Figure 26B:
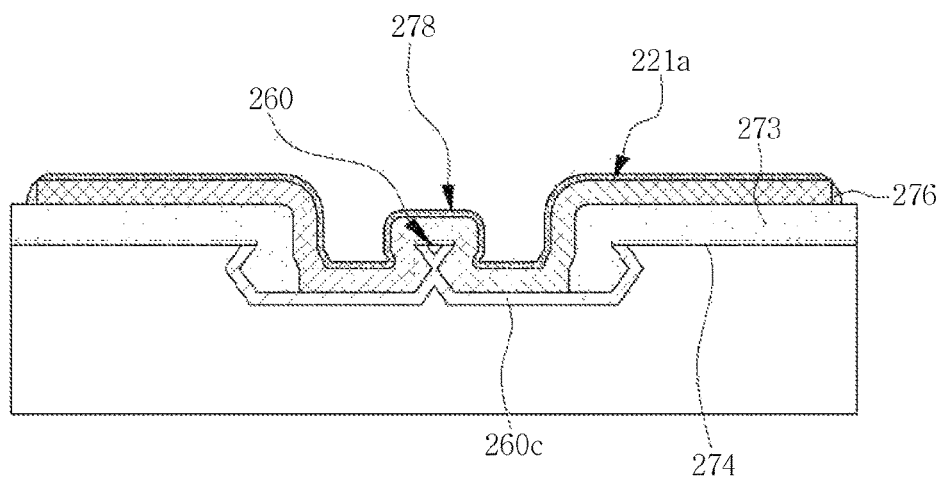
FIG. 26B is a cross-sectional view thereof when viewed from B-B'.

As illustrated in FIGS. 26A (a cross-sectional view taken along the line A-A' of FIG. 13) and 26B (a cross-sectional view taken along the line B-B' of FIG. 13), the silicide metal layer 277 is primarily annealed, after which the unreacted metal layer 277, other than the silicide metal layer 277 on surfaces of both ends of the nanowire 260 of the photodetection region A, the source 221*b*, the drain 221*c* and the gate 221*a*, is removed. After removal of the unreacted silicide metal layer 277, secondary annealing is performed, thus forming the silicide 278.

Figure 27A:
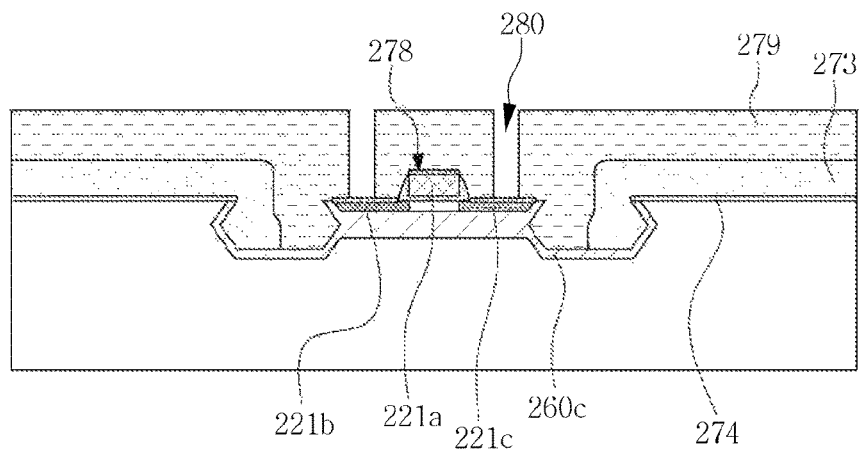
FIG. 27A is a cross-sectional view when viewed from A-A', illustrating the formation of a dielectric layer having a contact hole therein, in the process of manufacturing the image sensor according to the second embodiment of the present invention.
Figure 27B:
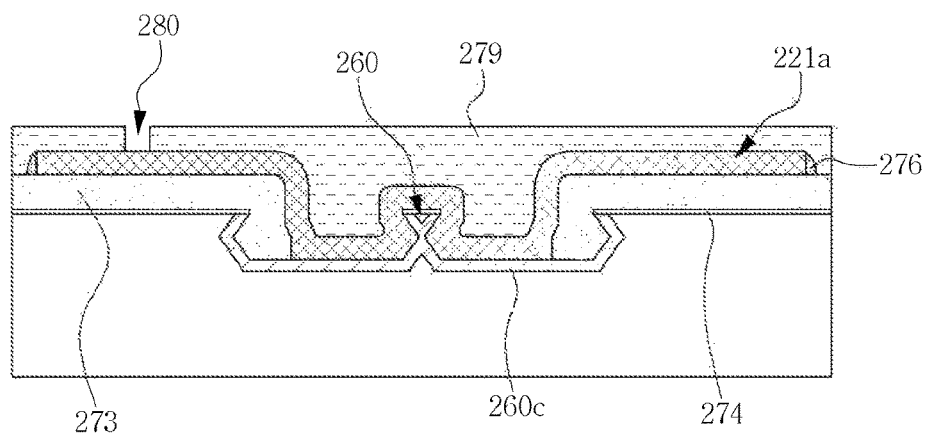
FIG. 27B is a cross-sectional view thereof when viewed from B-B'.

As illustrated in FIGS. 27A (a cross-sectional view taken along the line A-A' of FIG. 13) and 27B (a cross-sectional view taken along the line B-B' of FIG. 13), the dielectric layer 279 having a contact hole 280 therein is formed on the substrate 230. Specifically, the dielectric layer 279 is formed on the substrate 230, and the contact hole 280 is formed through photolithography and dry etching.

As illustrated in FIGS. 28A (a cross-sectional view taken along the line A-A' of FIG. 13) and 28B (a cross-sectional view taken along the line B-B' of FIG. 13), the electrode 240 is formed on the dielectric layer 279, and the contact hole 280 is filled with a metal, whereby the electrode 240 is inserted into the contact hole 280. Specifically, a metal is deposited, and is then flattened using CMP (Chemical Mechanical Polishing). As such, in order to reduce the resistance of the electrode 240 and the silicide 278, annealing may be carried out. Finally, when the electrode 240 is patterned, the image sensor illustrated in FIG. 10 may be manufactured.

Although the embodiments of the present invention have been disclosed for illustrative purposes, those skilled in the art will appreciate that various modifications, additions and substitutions are possible, without departing from the scope and spirit of the invention as disclosed in the accompanying claims.

Accordingly, simple modifications or variations of the present invention fall within the scope of the present invention as defined in the accompanying claims.

What is claimed is:

1. An image sensor using a nanowire, comprising:
   a substrate;
   a nanowire structure formed of a part of the substrate, wherein a width of the nanowire structure increases toward a top and a bottom from a center, a lower end of the nanowire structure is connected to the substrate, and the side surfaces of the nanowire structure is spaced apart from the substrate;
   a silicon nanowire formed on top of the nanowire structure, supported by the nanowire structure, wherein the cross-section of the silicon nanowire has an inverted triangle shape with an inner angle θ that falls within a predetermined range, the silicon nanowire is electrically insulated from the substrate by a silicon oxide film formed on the center and side surfaces of the nanowire structure;
   a photodetector formed of the silicon nanowire and configured to sense incident light to produce photocurrent, a magnitude of which varies depending on an intensity of the incident light;
   a signal processing module configured to output photodetection current including information about the incident based on presence or absence of the photocurrent and a magnitude thereof; and
   an electrode configured to electrically connect the photodetector and the signal processing module to each other and formed on the photodetector and the signal processing module,
   wherein the signal processing module includes a plurality of MOSFETs (Metal-Oxide-Semiconductor Field-Effect Transistors) output photodetection current including information about the incident light based on a voltage of a capacitor varying depending on a magnitude of the photocurrent,
   wherein each of the MOSFETs includes:
      a source formed by implanting a dopant into one end of the nanowire;
      a drain formed by implanting the dopant into a remaining end of the nanowire;
      a gate oxide film formed between the source and the drain on the upper surface of the silicon nanowire; and
      a poly-silicon gate formed on the gate oxide film and on a side surface of the nanowire structure to surround the nanowire structure in a direction perpendicular to the longitudinal direction of the silicon nanowire.

2. The image sensor of claim 1, wherein the photodetector is configured such that one region and a remaining region of the nanowire are doped with a p-type dopant and an n-type dopant, respectively, so as to form a p-n junction between an n-type region and a p-type region in the nanowire.

3. The image sensor of claim 1, wherein the photodetector is configured such that the nanowire is doped with a p-type dopant or an n-type dopant and thus a resistance value of the nanowire varies depending on the intensity of the incident light.

4. An image sensor using a nanowire, comprising:
a substrate;
a photodetector formed of at least one silicon nanowire on the substrate and configured to sense incident light to produce photocurrent, a magnitude of which varies depending on an intensity of the incident light;
a signal processing module configured to include a plurality of MOSFETs (Metal-Oxide-Semiconductor Field-Effect Transistors) formed of a silicon nanowire on the substrate and to output photodetection current including information about the incident light based on a voltage of a capacitor varying depending on a magnitude of the photocurrent; and
an electrode configured to electrically connect the photodetector and the signal processing module to each other and formed on the photodetector and the signal processing module,
wherein each of the MOSFETs includes:
a source formed by implanting a dopant into one end of the nanowire;
a drain formed by implanting the dopant into a remaining end of the nanowire; and
a poly-silicon gate formed between the source and the drain,
wherein the signal processing module includes:
a first MOSFET circuit comprising a second nanowire formed continuously in a longitudinal direction from one end of a first nanowire on which the photodetector is formed; and
a second MOSFET circuit comprising a third nanowire, which is spaced apart from the first nanowire at a predetermined interval in a width direction.

5. The image sensor of claim 4, wherein the first MOSFET circuit includes:
a first MOSFET, which is spaced apart from the photodetector at a predetermined interval in a longitudinal direction of the first nanowire and which causes voltage of a capacitor connected to one end thereof to vary; and
a second MOSFET, which is spaced apart from the first MOSFET at a predetermined interval in the longitudinal direction of the first nanowire and which causes the voltage of the capacitor to initialize to a reference voltage, and
the second MOSFET circuit includes:
a third MOSFET comprising the third nanowire and producing current that varies depending on a magnitude of the voltage of the capacitor; and
a fourth MOSFET spaced apart from the third MOSFET at a predetermined interval in a longitudinal direction of the third nanowire and configured to transfer current produced from the third MOSFET to outside.

6. The image sensor of claim 4, wherein the first to third nanowires have an inverted triangular-shaped cross-section with an inner angle $\theta$ that falls within a predetermined range, and a surface thereof is covered with a silicon dioxide film.

7. The image sensor of claim 1, wherein the nanowire has a width smaller than that of a recess.

8. The image sensor of claim 1, wherein the nanowire is exposed to an environment.

9. The image sensor of claim 1, wherein the substrate has at least one recess, and wherein the silicon nanowire is placed inside the recess.

10. An image sensor using a nanowire, comprising:
a substrate;
a nanowire structure formed of a part of the substrate, a photodetector formed of the silicon nanowire and configured to sense incident light to produce photocurrent, a magnitude of which varies depending on an intensity of the incident light;
a signal processor configured to output photodetection current including information about the incident light based on presence or absence of the photocurrent and a magnitude thereof;
an electrode configured to electrically connect the photodetector and the signal processing module to each other and formed on the photodetector and the signal processing module; and
a poly-silicon gate formed on a gate oxide film and on a side surface of the nanowire structure to surround the nanowire structure in a direction perpendicular to a longitudinal direction of the silicon nanowire.

* * * * *